(12) United States Patent
Imamura et al.

(10) Patent No.: US 8,963,147 B2
(45) Date of Patent: Feb. 24, 2015

(54) THIN FILM TRANSISTOR, METHOD OF MANUFACTURING THE SAME, AND IMAGE DISPLAY DEVICE EQUIPPED WITH THIN FILM TRANSISTOR

(75) Inventors: Chihiro Imamura, Tokyo (JP); Yukari Miyairi, Ueda (JP); Hiroaki Koyama, Nonoichi (JP)

(73) Assignee: Toppan Printing Co., Ltd., Tokyo (JP)

( * ) Notice: Subject to any disclaimer, the term of this patent is extended or adjusted under 35 U.S.C. 154(b) by 30 days.

(21) Appl. No.: 13/876,419

(22) PCT Filed: Sep. 21, 2011

(86) PCT No.: PCT/JP2011/071482
§ 371 (c)(1),
(2), (4) Date: Mar. 27, 2013

(87) PCT Pub. No.: WO2012/043338
PCT Pub. Date: Apr. 5, 2012

(65) Prior Publication Data
US 2014/0217396 A1    Aug. 7, 2014

(30) Foreign Application Priority Data

Sep. 28, 2010 (JP) ................................ 2010-217410
Mar. 25, 2011 (JP) ................................ 2011-068149

(51) Int. Cl.
*H01L 29/10* (2006.01)
*H01L 29/786* (2006.01)
(Continued)

(52) U.S. Cl.
CPC ........ *H01L 29/7869* (2013.01); *H01L 27/1225* (2013.01); *H01L 29/66742* (2013.01); *G02F 1/167* (2013.01)
USPC  257/43; 257/59; 257/E51.005; 257/E51.006; 438/149

(58) Field of Classification Search
CPC .................... H01L 29/66742; H01L 27/1225; G02F 1/167
USPC ........ 257/43, 59, E51.005, E51.006; 438/149
See application file for complete search history.

(56) References Cited

U.S. PATENT DOCUMENTS 5,936,291 A * 8/1999 Makita et al. ................. 257/405
6,613,618 B1 * 9/2003 Nakanishi et al. ............ 438/162
(Continued)

FOREIGN PATENT DOCUMENTS

| JP | A-2007-220817 | 8/2007 |
| JP | A-2008-141119 | 6/2008 |

(Continued)

OTHER PUBLICATIONS

Apr. 2, 2013 International Preliminary Report on Patentability issued in International Application No. PCT/JP2011/071482 (with translation).

(Continued)

*Primary Examiner* — Long K Tran

(57) ABSTRACT

A thin film transistor includes, on an insulating substrate, at least: a gate electrode; a gate insulating layer; a source electrode; a drain electrode; a metal oxide layer including a semiconductor region and an insulating region, each of the semiconductor region and the insulating region being composed of a same metal oxide material; and an insulating protective layer. The semiconductor region includes a region between the source electrode and the drain electrode, and is overlaid on a part of each of them. The semiconductor region is formed between the gate insulating layer and the insulating protective layer to abut on at least one of them. The electric conductivity of the semiconductor region is higher than that of the insulating region.

12 Claims, 6 Drawing Sheets

(51) Int. Cl.
 *H01L 27/12* (2006.01)
 *H01L 29/66* (2006.01)
 *H01L 21/00* (2006.01)
 *G02F 1/167* (2006.01)

(56) References Cited

U.S. PATENT DOCUMENTS

| | | | |
|---|---|---|---|
| 8,685,787 B2 * | 4/2014 | Yamazaki | 438/104 |
| 2010/0044701 A1 | 2/2010 | Sano et al. | |
| 2010/0045179 A1 | 2/2010 | Sano et al. | |
| 2011/0042670 A1 | 2/2011 | Sato et al. | |

FOREIGN PATENT DOCUMENTS

| | | |
|---|---|---|
| JP | A-2008-235871 | 10/2008 |
| JP | A-2009-272427 | 11/2009 |
| JP | A-2009-275272 | 11/2009 |

OTHER PUBLICATIONS

Nomura et al., "Room-temperature fabrication of transparent flexible thin-film transistors using amorphous oxide semiconductors," Nature, vol. 432, Nov. 2004, pp. 488-492.

Nov. 8, 2011 International Search Report issued in International Application No. PCT/JP2011/071482 (with translation).

* cited by examiner

US 8,963,147 B2

THIN FILM TRANSISTOR, METHOD OF MANUFACTURING THE SAME, AND IMAGE DISPLAY DEVICE EQUIPPED WITH THIN FILM TRANSISTOR

TECHNICAL FIELD

The present disclosure relates to thin film transistors, methods of manufacturing thin film transistors, and image display devices equipped with thin film transistors.

BACKGROUND ART

Active-matrix FPDs (Flat Panel Displays), which are driven by thin film transistors with amorphous-silicon or polycrystalline-silicon channel layers, are the mainstream of general FPDs.

Production of high-quality amorphous silicon or polycrystalline silicon requires high deposition temperatures of 300° C. or thereabout. For this reason, in order to fabricate flexible devices, very expensive, high water-absorption films, i.e. films that are difficult to work with, including high thermal-resistance polyimide films must be used as their substrates.

In recent years, thin film transistors using organic semiconductor materials have been studied actively.

Because such organic semiconductor materials can be produced in a printing process without using a vacuum process, they can be potentially produced at reduced cost. Organic semiconductor materials also have an advantage that they can be mounted on a flexible plastic substrate.

However, the organic semiconductor materials have a very low mobility, and a low resistance to aging, so they have not been widely used.

In these circumstances, metal oxide semiconductor materials, which can be formed at low temperatures, have been in the spotlight recently.

A thin film transistor, which is produced by forming an amorphous InGaZnO material, an example of a metal oxide semiconductor material formable at low temperatures, on a PET (polyethylene terephthalate) substrate as a channel layer, has excellent characteristics including a mobility of 10 cm$^2$/Vs or thereabout, which is disclosed in the non-patent document 1.

Transistors having such a high mobility can be fabricated at room temperature, making it possible to form transistors on inexpensive and widely available plastic substrates, such as PET. This results in heightened expectations for widespread use of light and durable flexible displays.

CITATION LIST

Non-Patent Document 1

K. Nomura, et al, Nature, 432, 48, 8, 2004

SUMMARY OF INVENTION

As described in the non-patent document 1, wet etching can be used to apply a metal oxide semiconductor material as a channel layer.

However, wet etching may result in low microfabrication accuracy, and low throughput due to the necessity of drying process.

Embodiments of the invention address these issues by providing bottom-gate thin film transistors using metal oxide semiconductor materials, which can be manufactured in high quality and low cost because of the elimination of a patterning process for a semiconductor layer. In some aspects, the invention provides methods of manufacturing such bottom-gate thin film transistors, and provide image display device equipped with these bottom-gate thin film transistors.

In a first aspect, the invention relates to a thin film transistor. The thin film transistor includes, on an insulating substrate, at least a gate electrode, a gate insulating layer, a source electrode, a drain electrode, a metal oxide layer including a semiconductor region and an insulating region, each of the semiconductor region and the insulating region being composed of a same metal oxide material, and an insulating protective layer. The semiconductor region includes a region between the source electrode and the drain electrode, and is overlaid on a part of each of the source electrode and the gate electrode. The semiconductor region is formed between the gate insulating layer and the insulating protective layer to abut on at least one of the gate insulating layer and the insulating protective layer. One part of the gate insulating layer or of the insulating projective layer, which abuts on the semiconductor region, contains therein hydrogen atoms. A concentration of the hydrogen atoms contained in the one part of the gate insulating layer or of the insulating projective layer is set to be within a range from $1 \times 10^{20}/cm^3$ to $5 \times 10^{22}/cm^3$ inclusive. An other part of the gate insulating layer or of the insulating projective layer, which does not abut on the semiconductor region, contains therein hydrogen atoms. A concentration of the hydrogen atoms contained in the other part of the gate insulating layer or of the insulating projective layer is set to be lower than $1 \times 10^{20}/cm^3$.

In a second aspect, the gate electrode is formed on the insulating substrate, and the gate insulating layer is formed on the gate electrode and the insulating substrate. The metal oxide layer is formed on the gate insulating layer, and the source electrode and the drain electrode are formed on the metal oxide layer to abut on the semiconductor region. The insulating protective layer is formed on the source electrode, the drain electrode, and the metal oxide layer, and the gate insulating layer is composed of a first gate insulating layer abutting on the semiconductor region in the metal oxide layer, and a second gate insulating layer abutting on the insulating region in the metal oxide layer. The concentration of hydrogen atoms contained in the first gate insulating layer is set to be within a range from $1 \times 10^{20}/cm^3$ to $5 \times 10^{22}/cm^3$ inclusive. The concentration of hydrogen atoms contained in the second gate insulating layer is set to be lower than $1 \times 10^{20}/cm^3$.

In a third aspect, the first gate insulating layer is composed of silicon nitride.

In a fourth aspect, the second gate insulating layer includes any one of silicon oxide, silicon nitride, silicon oxynitride, and aluminum oxide.

In a fifth aspect, the gate electrode is formed on the insulating substrate, and the gate insulating layer is formed on the gate electrode and the insulating substrate. The metal oxide layer is formed on the gate insulating layer, the source electrode and the drain electrode are formed on the gate insulating layer, and the metal oxide layer is formed on the gate insulating layer, the source electrode, and the drain electrode. The insulating protective layer is formed on the source electrode, the drain electrode, and the metal oxide layer, and the insulating protective layer is composed of a first insulating protective layer abutting on the semiconductor region in the metal oxide layer, and a second protective layer abutting on the insulating region in the metal oxide layer. A concentration of hydrogen atoms contained in the first insulating protective layer is set to be within a range from $1 \times 10^{20}/cm^3$ to $5 \times 10^{22}/$ cm³ inclusive, and a concentration of hydrogen atoms contained in the second insulating protective layer is set to be lower than $1\times10^{20}/cm^3$.

In a sixth aspect, the first insulating protective layer is composed of silicon nitride.

In a seventh aspect, the second insulating protective layer includes any one of silicon oxide, silicon nitride, silicon oxynitride, and aluminum oxide.

In an eighth aspect, an electric conductivity of the semiconductor region is set to be within a range from $10^{-7}$ S/cm to $10^{-3}$ S/cm inclusive, and an electric conductivity of the insulating region is set to be lower than $10^{-7}$ S/cm.

In a ninth aspect, the metal oxide material includes any one of indium, zinc, and gallium.

In a tenth aspect, the insulating substrate is a resin substrate.

In an eleventh aspect there is provided an image display device. The image display device can include a thin film transistor array equipped with the thin film transistors arranged as discussed above, and an image display medium.

In a twelfth aspect, the image display medium is an electrophoresis display medium.

In a thirteenth aspect there is provided a method of manufacturing a thin film transistor. The thin film transistor includes, on an insulating substrate, at least a gate electrode, a gate insulating layer, a source electrode, a drain electrode, and a metal oxide layer including a semiconductor region and an insulating region. Each of the semiconductor region and the insulating region is composed of a same metal oxide material. The thin film transistor includes an insulating protective layer. The method includes the steps of: simultaneously forming the semiconductor region and the insulating region in the metal oxide layer using a same metal oxide material; forming the semiconductor region between the gate insulating layer and the insulating protective layer such that the semiconductor region abuts on at least one of the gate insulating layer and the insulating protective layer; and forming a part of the gate insulating layer or of the insulating protective layer using CVD. The part of the gate insulating layer or of the insulating protective layer abuts on the semiconductor region.

In a fourteenth aspect, the method further includes, in sequence, the steps of: forming the gate electrode on the insulating substrate; forming the gate insulating layer on the gate electrode and the insulating substrate; forming the metal oxide layer on the gate insulating layer; forming the source electrode and the drain electrode on the metal oxide layer such that the source electrode and the drain electrode abut on the semiconductor region; and forming the insulating protective layer on the source electrode, the drain electrode, and the metal oxide layer. In the method, the step of forming the gate insulating layer further includes the steps of: forming a first gate insulating layer on the insulating substrate and the gate electrode using CVD to abut on the semiconductor region in the metal oxide layer; and forming a second gate insulating layer on the insulating substrate and the gate electrode using CVD to abut on the insulating region in the metal oxide layer.

In a fifteenth aspect, the method further includes, in sequence, the steps of: forming the gate electrode on the insulating substrate; forming the gate insulating layer on the gate electrode and the insulating substrate; forming the source electrode and the drain electrode on the gate insulating layer; forming the metal oxide layer on the gate insulating layer, the source electrode, and the drain electrode; and forming the insulating protective layer on the source electrode, the drain electrode, and the metal oxide layer. In the method, the step of forming the insulating protective layer further comprises the steps of: forming a first insulating protective layer on the semiconductor region in the metal oxide layer using CVD to abut on the semiconductor region; and forming a second insulating protective layer on the insulating region in the metal oxide layer using CVD to abut on the insulating region.

Effect of the Invention

According to the invention recited in claim 1 of the present invention, a bottom-gate thin film transistor based on a metal oxide semiconductor enables a patterning process of the metal oxide layer, i.e. a wet etching process, to be eliminated. This makes it possible to simplify the manufacturing processes of the thin film transistor.

This provides the thin film transistor manufacturable in high quality and low cost and the method of manufacturing the thin film transistor, and an image display device equipped with the thin film transistor.

According to the invention recited in claim 2 of the present invention, the electric conductivity of the semiconductor region fog ivied on the first gate insulating layer as the metal oxide layer is higher than that of the insulating layer formed on the second gate insulating layer as the metal oxide layer.

Note that the present invention is based on the fact that changing the composition in the film enables the electric conductivity of a metal oxide layer to be easily controlled. If a gate insulating layer, which serves as a foundation layer for the metal oxide layer, contains hydrogen atoms, the hydrogen atoms diffuse from the gate insulating layer into the metal oxide layer, and the diffused hydrogen atoms act as donors. This increases the electric conductivity.

The concentration of hydrogen atoms in each of the first gate insulating layer and the second gate insulating layer is changed. This change permits, during deposition of the metal oxide layer constituting the thin film transistor, the semiconductor region and the insulating region to be simultaneously formed respectively on the gate insulating layer with the high concentration of hydrogen atoms and on the gate insulating layer with the low concentration of hydrogen atoms. That is, the semiconductor region has a high conductivity and shows semiconductor characteristics, and the insulating region has a low conductivity and shows insulating characteristics. This results in elimination of a patterning process of the semiconductor layer.

According to the invention recited in claim 5 of the present invention, the electric conductivity of the metal oxide layer formed below the first insulating protective layer is higher than that of the metal oxide layer formed below the second insulating protective layer.

Note that the present invention is based on the fact that changing the composition in the film enables the electric conductivity of a metal oxide layer to be easily controlled. If an insulating protective layer, which abuts on the metal oxide layer, contains hydrogen atoms, the hydrogen atoms diffuse from the insulating protective layer into the metal oxide layer, so that the diffused hydrogen atoms act as if they are donors. This increases the electric conductivity of the metal oxide layer.

The concentration of hydrogen atoms in each of the first gate insulating layer and the second gate insulating layer is changed. This change permits, during deposition of the metal oxide layer constituting the thin film transistor, the semiconductor region and the insulating region to be simultaneously formed respectively on the gate insulating layer with the high concentration of hydrogen atoms and on the gate insulating layer with the low concentration of hydrogen atoms. That is, the semiconductor region has a high conductivity and shows semiconductor characteristics, and the insulating region has a low conductivity and shows insulating characteristics. This results in elimination of a patterning process of the semiconductor layer.

The concentration of hydrogen atoms in the first insulating protective layer abutting on the metal oxide layer and that of the second insulating protective layer are changed. These changes permit regions having different electric-conductivity characteristics to be formed in a single metal oxide layer formed below the insulating protective layer. That is, irrespective of the single metal oxide layer, a semiconductor region is formed in one part of the metal oxide layer, which is located below the first insulating protective layer having a high concentration of hydrogen atoms, and an insulating region is formed in the other part of the metal oxide layer, which is located below the second insulating protective layer having a low concentration of hydrogen atoms.

According to the invention recited in claim 8 of the present invention, the gate insulating layer and the metal oxide layer including the semiconductor region and the insulating region are deposited such that the electric conductivity of the semiconductor region is set to be within the range from $10^{-7}$ S/cm to $10^{-3}$ S/cm inclusive, and the electric conductivity of the insulating region is set to be lower than $10^{-7}$ S/cm. This enables thin film transistors having high reliability to be obtained.

According to the invention recited in claim 9 of the present invention, the metal oxide material includes any one of indium, zinc, and gallium. This enables thin film transistors having excellent transistor characteristics to be obtained.

According to the invention recited in claim 10 of the present invention, the insulating substrate is a resin substrate, making it possible to obtain light-weight, flexible thin film transistors.

According to the invention recited in claim 3 of the present invention, the first gate insulating layer is composed of silicon nitride deposited by CVD. This makes easy that the concentration of hydrogen atoms in the first gate insulating layer is within the range from $1\times10^{20}/cm^3$ to $5\times10^{22}/cm^3$ inclusive, and possible that the gate insulating layer has a sufficient withstand voltage.

According to the invention recited in claim 13 of the present invention, a silicon nitride layer, which is deposited by CVD at a low temperature of, for example, 150° C. or thereabout, has many hydrogen atoms derived from a raw material, particularly, $NH_3$ usually used as a raw material. For this reason, the hydrogen atoms likely diffuse into the metal oxide layer abutting on the silicon nitride layer, resulting in an easy increase of the electric conductivity of the semiconductor region.

According to the invention recited in claim 14 of the present invention, forming the second gate insulating layer using silicon oxide formed by CVD makes it possible to easily control the concentration of hydrogen atoms in the metal oxide layer, i.e. the insulating layer, to be equal to or lower than $10^{20}/cm^3$. In addition, this makes it possible for the second gate insulating layer to have a sufficient withstand voltage as the gate insulating layer.

According to the invention recited in claim 15 of the present invention, fanning the second insulating protective layer using silicon oxide formed by CVD makes it possible to easily control the concentration of hydrogen atoms in the metal oxide layer, i.e. the insulating layer, to be equal to or lower than $10^{20}/cm^3$. In addition, this makes it possible for the second insulating protective layer to have a sufficient withstand voltage as the gate insulating layer.

DESCRIPTION OF EMBODIMENT

Each thin film transistor according to the present invention includes, on an insulating substrate, a gate electrode; a gate insulating layer; a source electrode; a drain electrode; a metal oxide layer having a semiconductor region and an insulating layer composed of the same metal oxide material; and an insulating protective layer. The semiconductor region includes a region between the source electrode and the drain electrode, and is overlaid on a part of each of the source electrode and the gate electrode.

The semiconductor region is so formed between the gate insulating layer and the insulating protective layer as to abut on at least one of the gate insulating layer and the insulating protective layer.

The concentration of hydrogen atoms contained in one part of the gate insulating layer or of the insulating projective layer, which abuts on the semiconductor region, is set to be within the range from $1\times10^{20}/cm^3$ to $5\times10^{22}/cm^3$ inclusive, and the concentration of hydrogen atoms contained in the other part of the gate insulating layer or of the insulating projective layer, which do not abut on the semiconductor region, is set to be lower than $1\times10^{20}/cm^3$.

This results in:

a part of the metal oxide layer, which contacts a part of the gate insulating layer with the high concentration of hydrogen atoms or which contacts the insulating protective layer with the high concentration of hydrogen atoms, becoming a semiconductor region; and another part of the metal oxide layer, which contacts another part of the gate insulating layer with the low concentration of hydrogen atoms or which contacts another part of the insulating protective layer with the low concentration of hydrogen atoms, becoming an insulating region.

Thus, it is possible to separately form the semiconductor region and the insulating region without patterning of metal oxide layers.

Next, first and second embodiments as specific structural examples of the present invention will be described hereinafter.

First Embodiment

The structure of a thin film transistor, and of an image display device equipped with the thin film transistor, and the method of manufacturing the thin film transistor according to the first embodiment of the present invention will be described with reference to the drawings.

(Structure)

The structure of the thin film transistor according to the first embodiment will be described first with reference to FIG. 1.

Figure 1:
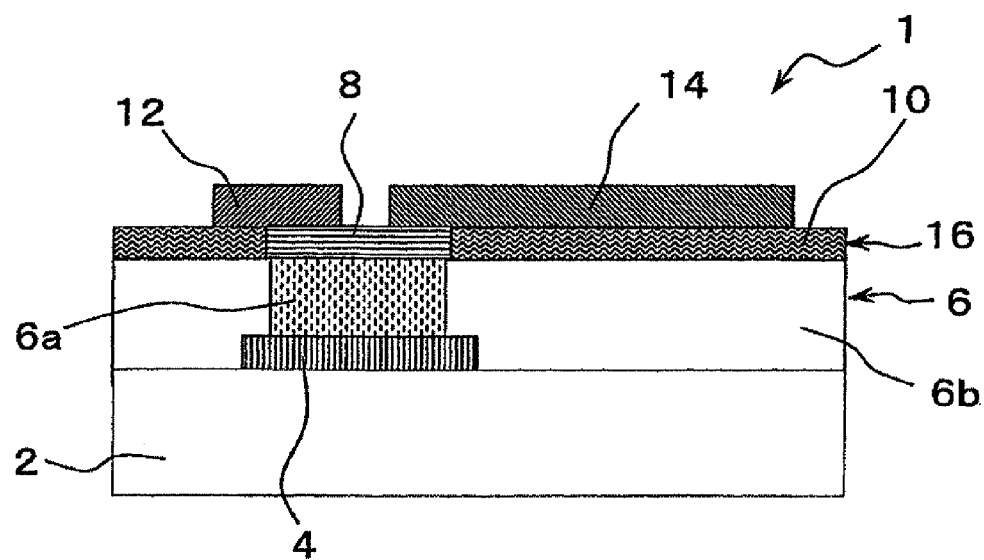
FIG. 1 is a cross sectional view schematically illustrating a thin film transistor according to a first embodiment of the present invention.

Referring to FIG. 1, the thin film transistor 1 is comprised of an insulating substrate 2, a gate electrode 4; a gate insulating layer 6; a semiconductor region 8, an insulating region 10, a source electrode 12, and a drain electrode 14.

Specifically, the thin film transistor 1 is designed as a bottom-gate top-contact thin film transistor.

(Detailed Structure of the Insulating Substrate 2)

Hereinafter, the detailed structure of the insulating substrate 2 will be described hereinafter with reference to FIG. 1.

As a material of the insulating substrate 2, for example, a glass or plastic substrate can be used.

In the first embodiment, a plastic substrate is used as a material of the insulating substrate 2, so that a resin substrate is formed as the insulating substrate 2.

As a plastic substrate, for example, poly methyl methacrylate, polyacrylate, polycarbonate, polystyrene, polyethylene sulfide, polyethersulfone (PES), polyolefin, polyethylene terephthalate, polyethylene naphthalate (PEN), cycloolefin polymer, polyethersulfone, triacetylcellulose, polyvinyl fluoride film, ethylene-tetrafluoroethylene copolymer resin, weather-resistant polyethylene terephthalate, weather-resistant polypropylene, glass-fiber reinforced acrylic resin film, glass-fiber reinforced polycarbonate, transparent polyimide, fluorine-based resin, cyclic polyolefin resin, and so on can be used.

A single substrate in these substrates can be used, and a composite substrate formed by laminating two or more substrates can be used. A substrate on which a resin layer, such as a color filter, is formed can be laminated on a glass or plastic substrate.

(Detailed Structure of the Gate Electrode 4)

Hereinafter, the detailed structure of the gate electrode 4 will be described hereinafter with reference to FIG. 1.

The gate electrode 4 is formed to overlay a part of the insulating substrate 2.

As a material of the gate electrode 4, oxide materials, such as indium oxide ($In_2O_3$), tin oxide ($SnO_2$), zinc oxide (ZnO), cadmium oxide (CdO), indium cadmium oxide ($CdIn_2O_4$), cadmium tin oxide ($Cd_2SnO_4$), zinc tin oxide ($Zn_2SnO_4$), or indium zinc oxide (In—Zn—O) can be preferably used.

As a material of the gate electrode 4, using, for example, impurity-doped oxide materials set forth above is preferable for an increase in electric conductivity. For example, tin-doped indium oxide, molybdenum-doped indium oxide, titanium-doped indium oxide, antimony-doped tin oxide, fluorine-doped tin oxide, indium-doped zinc oxide, aluminum-doped zinc oxide, gallium-doped zinc oxide, or other similar doped oxide materials can be used. In these doped oxide materials, tin-doped indium oxide, called ITO, is particularly suitable because of its low resistivity.

As a material of the gate electrode 4, using, for example, a low-resistance metal material, such as Au, Ag, Cu, Cr, Al, Mg, or Li, is suitable.

As a material of the gate electrode 4, using a laminate of conductive oxide materials and low-resistance metal materials can be used. In this case, the three-layer laminate of a conductive oxide film, a metal film, and a conductive oxide film is particularly suitable for preventing oxidation and aging of the metal material.

As a material of the gate electrode 4, using an organic conductive material, such as polyethylenedioxythiophene (PEDOT), is suitable.

(Detailed Structure of the Gate Insulating Layer 6)

Hereinafter, the detailed structure of the gate insulating layer 6 will be described hereinafter with reference to FIG. 1.

The gate insulating layer 6 is formed on the insulating substrate 2 and the gate electrode 4 to overlay a part of the gate electrode 4. The gate insulating layer 6 is composed of a first gate insulating layer 6a and a second gate insulating layer 6b.

The gate insulating layer 6 preferably has a thickness within the range from 50 nm to 2 μm inclusive.

The first insulating layer 6a is formed to overlay a part of the gate electrode 4, and located in abutment with the semiconductor region 8.

As a material of the first gate insulating layer 6a, silicon nitride deposited by CVD is for example used. As a starting material of silicon nitride deposited by CVD, $SiH_4/NH_3$ or the like is used. Note that a material of the first gate insulating layer 6a is not limited to silicon nitride deposited by CVD.

The concentration of hydrogen atoms contained in the first insulating layer 6a is set to be within the range from $1 \times 10^{20}/cm^3$ to $5 \times 10^{22}/cm^3$ inclusive.

The reason why the concentration of hydrogen atoms contained in the first insulating layer 6a is set to be within the range from $1 \times 10^{20}/cm^3$ to $5 \times 10^{22}/cm^3$ inclusive is that the electric conductivity of the semiconductor region 8 formed on the first insulating layer 6a can be increased.

Because the gate insulating layer 6 includes a lot of hydrogen atoms, the hydrogen atoms are likely to diffuse into the semiconductor region 8 as the metal oxide layer formed on the gate insulating layer 6. Thus, the diffused hydrogen atoms act as P-type dopants in the metal oxide layer to increase the electric conductivity of the semiconductor layer 8 as the metal oxide layer.

If the concentration of the hydrogen atoms included in the first gate insulating layer 6a were lower than $1 \times 10^{20}/cm^3$, a low amount of hydrogen atoms, which diffuse into the metal oxide layer, could not contribute to an increase of the electric conductivity of the metal oxide layer. This could make it difficult for the semiconductor region 8 formed on the first gate insulating layer 6a to serve as a semiconductor layer.

In the first embodiment, the first gate insulating layer 6a is made from a material deposited by CVD as described later. For this reason, the hydrogen atoms included in the first gate insulating layer 6a are derived from $NH_3$ gas normally used as a source gas.

Thus, if the concentration of the hydrogen atoms included in the first gate insulating layer 6a were higher than $5 \times 10^{22}/cm^3$, the concentration of $NH_3$ gas as the source gas could be excessively high. This could make it difficult to form an SiN film, resulting in a difficulty depositing the gate insulating layer 6 using CVD.

The resistivity of the first gate insulating layer 6a is preferably set to be equal to or higher than $10^{11}$ Ω·cm, more preferably to be equal to or higher than $10^{12}$ Ω·cm. If the resistivity of the first gate insulating layer 6a were lower than $10^{11}$ Ω·cm, the insulating layer 6 as a whole could not exert sufficient performance, resulting an increase of gate leakage current. Thus, it could be difficult to achieve good characteristics of the device.

The second gate insulating layer 6b is formed to overlay the insulating layer 2 and a part of the gate electrode 4 uncovered by the first gate insulating layer 6a. The second gate insulating layer 6b is located in abutment with the insulating region 10.

As a material of the second gate insulating layer 6b, for example, silicon oxide, silicon nitride, silicon oxynitride, or aluminum oxide is particularly suitable.

In the first embodiment, silicon oxide deposited by CVD is used as a material of the second gate insulating layer 6b.

In the first embodiment, the second gate insulating layer 6b is formed as a layer including any one of silicon oxide, silicon nitride, silicon oxynitride, and aluminum oxide.

As a material of the second gate insulating layer 6b, tantalum oxide, yttrium oxide, hafnium oxide, hafnium aluminate, zirconium oxide, titanium oxide, or the like can be used. Using one of these materials for the second gate insulating layer 6b can achieve sufficient insulating performance to reduce gate leak current.

Note that a material of the second gate insulating layer 6b is not limited to these materials.

The concentration of hydrogen atoms contained in the second gate insulating layer 6b is set to be lower than $1 \times 10^{20}/cm^3$.

The reason why the concentration of hydrogen atoms contained in the second gate insulating layer 6b is set to be lower than $1 \times 10^{20}/cm^3$ is to permit the electric conductivity of the insulating layer 10 formed on the second gate insulating layer 6b as a metal oxide layer to be lower than that of the semiconductor region 8 formed on the first insulating layer 6a. This allows the second gate insulating layer 6b to insulate metal-oxide semiconductor layers adjacent to each other of the TFT.

If the concentration of the hydrogen atoms included in the second gate insulating layer 6b were equal to or higher than $10^{20}/cm^3$, the hydrogen atoms included in the second gate insulating layer 6b could diffuse into the insulating region 10 as a metal oxide layer on the second gate insulating layer 6b. This could increase the electric conductivity of the insulating region 10 as a metal oxide layer on the second gate insulating layer 6b, resulting in the normal activity of the insulating region 10 becoming weak.

The resistivity of the second gate insulating layer 6b is preferably set to be equal to or higher than $10^{11}$ Ω·cm, more preferably to be equal to or higher than $10^{12}$ Ω·cm. If the resistivity of the second gate insulating layer 6b were lower than $10^{11}$ Ω·cm, the insulating layer 6 as a whole could not exert sufficient performance, resulting an increase of gate leakage current. Thus, it could be difficult to achieve good characteristics of the device.

(Detailed Structure of the Semiconductor Region 8)

Hereinafter, the detailed structure of the semiconductor region 8 will be described hereinafter with reference to FIG. 1.

The semiconductor region 8 includes a channel, and is formed on the first gate insulating layer 6a in the gate insulating layer 6.

The semiconductor region 8 and the insulating region 10 constitute the metal oxide layer 16 set forth above. Specifically, the semiconductor region 8 and the insulating region 10 are simultaneously deposited to exist in the film of the single metal oxide layer 16.

As a material of the semiconductor region 8, an oxide including any one of the following elements zinc, indium, tin, tungsten, magnesium, and gallium can be used.

In the first embodiment, a material including one of indium, zinc, and gallium is used as a material of the semiconductor region 8. As a material of the semiconductor region 8, known materials including zinc oxide, indium oxide, indium zinc oxide, tin oxide, tungsten oxide, indium-gallium-zinc oxide (In—Ga—Zn—O) can be used.

A material of the semiconductor region 8 is not limited to these materials.

Note that the thickness, i.e. the film thickness, of the semiconductor region 10 is preferably set to be equal to or higher than 10 nm. This is because, if the film thickness of the semiconductor region 8 were lower than 10 nm, island growth could cause non-semiconducting portions to be formed in the semiconductor region 8.

(Detailed Structure of the Insulating Region 10)

Hereinafter, the detailed structure of the insulating region 10 will be described hereinafter with reference to FIG. 1.

The insulating region 10 is formed on a part of the gate insulating layer 6; the part of the gate insulating layer 6 abuts on the second gate insulating layer 6b.

Like the semiconductor region 8, as a material of the insulating region 10, an oxide including any one of the following elements zinc, indium, tin, tungsten, magnesium, and gallium can be used.

In the first embodiment, a material including one of indium, zinc, and gallium is used as a material of the insulating region 10. Like the semiconductor region 8, as a material of the insulating region 10, known materials including zinc oxide, indium oxide, indium zinc oxide, tin oxide, tungsten oxide, indium-gallium-zinc oxide (In—Ga—Zn—O) can be used.

A material of the insulating region 10 is not limited to these materials.

Note that the thickness, i.e. the film thickness, of the insulating region 10 is preferably set to be equal to or higher than 10 nm. This is because, if the film thickness of the insulating region 10 were lower than 10 nm, island growth could cause non-semiconducting portions to be formed in the insulating region 10. The electric conductivity of the insulating region 10 is preferably set to be lower than $10^{-9}$ S/cm. This is because, if the electric conductivity of the insulating region 10 were equal to or higher than $10^{-9}$ S/cm, the insulating region 10 could not exert sufficient performance, and leakage current could flow from the semiconductor region 8.

(Detailed Structure of the Source Electrode 12)

Hereinafter, the detailed structure of the source electrode 12 will be described hereinafter with reference to FIG. 1.

The source electrode 12 is formed to overlay a part of the metal oxide layer 16.

Like the gate electrode 4, as a material of the source electrode 10, oxide materials, such as indium oxide ($In_2O_3$), tin oxide ($SnO_2$), zinc oxide (ZnO), cadmium oxide (CdO), indium cadmium oxide ($CdIn_2O_4$), cadmium tin oxide ($Cd_2SnO_4$), zinc tin oxide ($Zn_2SnO_4$), or indium zinc oxide (In—Zn—O) can be preferably used.

Like the gate electrode 4, as a material of the source electrode 12, using, for example, impurity-doped oxide materials set forth above is preferable for an increase in electric conductivity. For example, tin-doped indium oxide, molybdenum-doped indium oxide, titanium-doped indium oxide, antimony-doped tin oxide, fluorine-doped tin oxide, indium-doped zinc oxide, aluminum-doped zinc oxide, gallium-doped zinc oxide, or other similar doped oxide materials can be used. In these doped oxide materials, tin-doped indium oxide, called ITO, is particularly suitable because of its low resistivity.

Like the gate electrode 4, as a material of the source electrode 12, using, for example, a low-resistance metal material, such as Au, Ag, Cu, Cr, Al, Mg, or Li, is suitable.

Like the gate electrode 4, as a material of the source electrode 12, using the laminate of conductive oxide materials and low-resistance metal materials can be used. In this case, the three-layer laminate of a conductive oxide film, a metal film, and a conductive oxide film is particularly suitable for preventing oxidation and aging of the metal material.

Like the gate electrode 4, as a material of the source electrode 12, using an organic conductive material, such as polyethylenedioxythiophene (PEDOT), is suitable.

(Detailed Structure of the Drain Electrode 14)

Hereinafter, the detailed structure of the drain electrode 14 will be described hereinafter with reference to FIG. 1.

The drain electrode 14 is formed to overlay a part of the metal oxide layer 16 uncovered by the source electrode 12.

Like the gate electrode 4, as a material of the drain electrode 14, oxide materials, such as indium oxide ($In_2O_3$), tin oxide ($SnO_2$), zinc oxide (ZnO), cadmium oxide (CdO), indium cadmium oxide ($CdIn_2O_4$), cadmium tin oxide ($Cd_2SnO_4$), zinc tin oxide ($Zn_2SnO_4$), or indium zinc oxide (In—Zn—O) can be preferably used.

Like the gate electrode 4, as a material of the drain electrode 14, using, for example, impurity-doped oxide materials set forth above is preferable for an increase in electric conductivity. For example, tin-doped indium oxide, molybdenum-doped indium oxide, titanium-doped indium oxide, antimony-doped tin oxide, fluorine-doped tin oxide, indium-doped zinc oxide, aluminum-doped zinc oxide, gallium-doped zinc oxide, or other similar doped oxide materials can be used. In these doped oxide materials, tin-doped indium oxide, called ITO, is particularly suitable because of its low resistivity.

Like the gate electrode 4, as a material of the drain electrode 14, using, for example, a low-resistance metal material, such as Au, Ag, Cu, Cr, Al, Mg, or Li, is suitable.

Like the gate electrode 4, as a material of the drain electrode 14, using the laminate of conductive oxide materials and low-resistance metal materials can be used. In this case, the three-layer laminate of a conductive oxide film, a metal film, and a conductive oxide film is particularly suitable for preventing oxidation and aging of the metal material.

Like the gate electrode 4, as a material of the drain electrode 14, using an organic conductive material, such as polyethylenedioxythiophene (PEDOT), is suitable.

Note that the same material can be used as those of the gate electrode 4, the source electrode 12, and the drain electrode 14. Different materials can also be used as those of the gate electrode 4, the source electrode 12, and the drain electrode 14. However, the same material is preferably used as those of the source electrode 12 and the drain electrode 14 for the purpose of reducing the number of manufacturing processes.

(Image Display Device)

Next, the structure of the image display device equipped with the thin film transistor 1 will be described with reference to FIG. 1.

The image display device (not shown) is designed as, for example, a color display, and provided with a thin-film transistor array (not shown) including the thin film transistors 1, and an image display medium (not shown).

The image display medium of the image display device is an electrophoresis display medium.

Note that, as the thin film transistors 1 with which the image display device is equipped, thin film transistors manufactured by methods of manufacturing a thin film transistor described later can be used.

Next, a method of manufacturing the thin film transistor 1 will be described with reference to FIG. 1.

In manufacturing the thin film transistor 1, a gate-electrode forming process is performed, which forms the gate electrode 4 on the insulating substrate 2. Specifically, the method of manufacturing the thin film transistor 1 includes the gate-electrode forming process.

In the gate-electrode forming process, as a method of forming the gate electrode 4, for example, vacuum deposition, ion plating, sputtering, laser ablation, plasma CVD (Chemical Vapor Deposition), photo-assisted CVD, or hot-wire CVD can be used.

As the method of forming the gate electrode 4, for example, an aforementioned conductive material in the form of a paste or an ink is applied by screen printing, letterpress printing, intaglio printing, reverse offset printing, ink jet, or the like, and fired to be formed as the gate electrode 4.

Note that a method of forming the gate electrode 4 is not limited to the aforementioned methods.

After the gate electrode 4 is formed on the insulating substrate 2, a gate-insulating layer forming process is performed, which forms the gate insulating layer 6 on the insulating substrate 2 and the gate electrode 4. Specifically, the method of manufacturing the thin film transistor 1 includes the gate-insulating layer forming process.

In the gate-insulating layer forming process, as a method of forming the first gate insulating layer 6a, CVD is used.

In the gate-insulating layer forming process, as a method of forming the second gate insulating layer 6b, for example, sputtering, plasma CVD, or atomic layer deposition is preferably used. In addition, vacuum deposition, ion plating, or laser ablation can be used as a method of forming the second gate insulating layer 6b.

In the process of forming the second gate insulating layer 6b, a composition gradient along the film thickness direction can be performed.

After the gate insulating layer 6 is formed on the insulating substrate 2 and the gate electrode 4 in the gate-insulating layer forming process, the metal-oxide layer forming process is performed, which forms the metal oxide layer 4 on the gate insulating layer 6. Specifically, the method of manufacturing the thin film transistor 1 includes the metal-oxide layer forming process.

The metal-oxide layer forming process includes a semiconductor-region forming process for forming the semiconductor region 8, and an insulating-region forming process for forming the insulating region 10.

In the metal-oxide layer forming process according to the first embodiment, the semiconductor-region forming process and the insulating-region forming process are simultaneously performed. Specifically, in the method of manufacturing the thin film transistor 1 according to the first embodiment, the semiconductor region 8 and the insulating region 10 are simultaneously deposited.

In the metal-oxide layer forming process, as a method of simultaneously forming the semiconductor region 8 and the insulating region 10, for example, sputtering, pulse-laser deposition, vacuum deposition, CVD, a sol-gel process, or the like is used. Preferably, as a method of simultaneously forming the semiconductor region 8 and the insulating region 10, sputtering, pulsed laser deposition, vacuum deposition, or CVD is used.

As the sputtering, RF magnetron sputtering, DC sputtering, or ion beam sputtering can be used. As the vacuum deposition, heating deposition, electron-beam deposition, or ion plating can be used. As the CVD, hot-wire CVD or plasma CVD can be used.

Note that a method of forming the semiconductor region 8 and the insulating region 10 is not limited to the aforementioned methods.

In the metal-oxide forming process, in forming the semiconductor region 8, the semiconductor region 8 is deposited while the electric conductivity of the semiconductor region 8 is set to be within the range from $10^{-7}$ S/cm to $10^{-3}$ S/cm inclusive.

In this process, only depositing the semiconductor region 8 on the gate insulating layer 6 uniformly without pattering permits hydrogen atoms from the first gate insulating layer 6a to diffuse, resulting in the semiconductor region 8 located on the first gate insulating layer 6a becoming a semiconductor layer.

On the other hand, in the metal-oxide forming process, in forming the insulating region 10, the insulating region 10 is deposited with its electric conductivity being set to be lower than $10^{-7}$ S/cm.

Because the insulating layer 10 located on the second gate insulating layer 6b remains as an insulating layer with the electric conductivity lower than $10^{-7}$ S/cm, it is possible to insulate adjacent semiconductor layers in the TFT without performing a semiconductor-layer patterning process, thus eliminating such a semiconductor-layer patterning process.

Depositing the gate insulating layer 6 and the metal oxide layer 16 while the electric conductivity of the semiconductor region 8 is equal to or higher than $10^{-7}$ S/cm and equal to or lower than $10^{-3}$ S/cm and that of the insulating region 10 is lower than $10^{-7}$ S/cm allows a thin film transistor 1 with high reliability to be obtained. It is also possible to provide the method of manufacturing the thin film transistor 1 with high productivity because no patterning process is required.

After the metal oxide layer 16 is deposited on the gate insulating layer 6 in the metal-oxide layer forming process, a source-electrode forming process and a drain-electrode forming process are performed, which form the source electrode 12 and the drain electrode 16 on the metal oxide layer 16. Specifically, the method of manufacturing the thin film transistor 1 includes the source-electrode forming process and the drain-electrode forming process.

In each of the source-electrode forming process and the drain-electrode forming process, as a method of forming a corresponding one of the source electrode 12 and the drain electrode 14, for example, vacuum deposition, ion plating, sputtering, laser ablation, plasma CVD, photo-assisted CVD, or hot-wire CVD can be used in the same manner as the method of forming the gate electrode 4.

As the method of forming each of the source electrode 12 and the drain electrode 14, for example, an aforementioned conductive material in the formation of a paste or an ink is applied by screen printing, letterpress printing, intaglio printing, reverse offset printing, ink jet, or the like, and fired to be formed as a corresponding one of the source electrode 12 and the drain electrode 14.

Note that a method of forming each of the source electrode 12 and the drain electrode 14 is not limited to the aforementioned method.

After the formation of the source electrode 12 and the drain electrode 14, the manufacturing of the thin film transistor 1 is terminated.

It is preferable to form a sealing layer on the semiconductor region of the metal oxide layer as needed. As an inorganic material constituting the sealing layer, silicon oxide, silicon nitride, silicon oxynitride, or aluminum oxide is particularly suitable. Tantalum oxide, yttrium oxide, hafnium oxide, hafnium aluminate, zirconium oxide, titanium oxide, or the like can be used as an inorganic material constituting the sealing layer. Using one of these inorganic materials for the sealing layer can achieve sufficient sealing performance. These inorganic materials can be formed by sputtering, plasma CVD, or atomic deposition, but vacuum deposition, ion plating, laser ablation, or another method can be used as a method of forming the sealing layer.

As an organic material constituting the encapsulation layer, fluorinated resin having fluorine atoms substituted in place of hydrogen atoms in polymeric resin can be used. Specifically, fluorinated epoxy, fluorinated acrylic, fluorinated polyimide, polyvinylidene fluoride, a copolymer of fluorinated olefin and propylene, a copolymer of fluorinated olefin and vinyl ether, a copolymer of fluorinated olefin and vinyl ester, a copolymer of fluorinated olefin, fluorinated cyclic ether copolymer, or the like can be used as an organic material constituting the encapsulation layer. Fluorinated resin includes partially fluorinated resin in which some of hydrogen atoms have been replaced with fluorine atoms, and perfluorinated resin in which all hydrogen atoms have been replaced with fluorine atoms. Perfluorinated resin is more suitable than partially fluorinated resin. Fluorinated resin has superior stability different from normal non-fluorinated resin, such as epoxy and acrylic, resulting in it having no effect on the semiconductor layer. For an inorganic insulating film, patterning is preferably performed in a liftoff process. For a fluorinated resin film, patterning can be performed by printing, such as screen printing, flexographic printing, reverse printing, or ink jet printing. A fluorinated film can be formed over the semiconductor region by spin coating or die coating, and thereafter contact portions can be stripped from the fluorinated film with tweezers or the like.

(Image Display Device Using the Thin Film Transistor 1)

Figure 3:
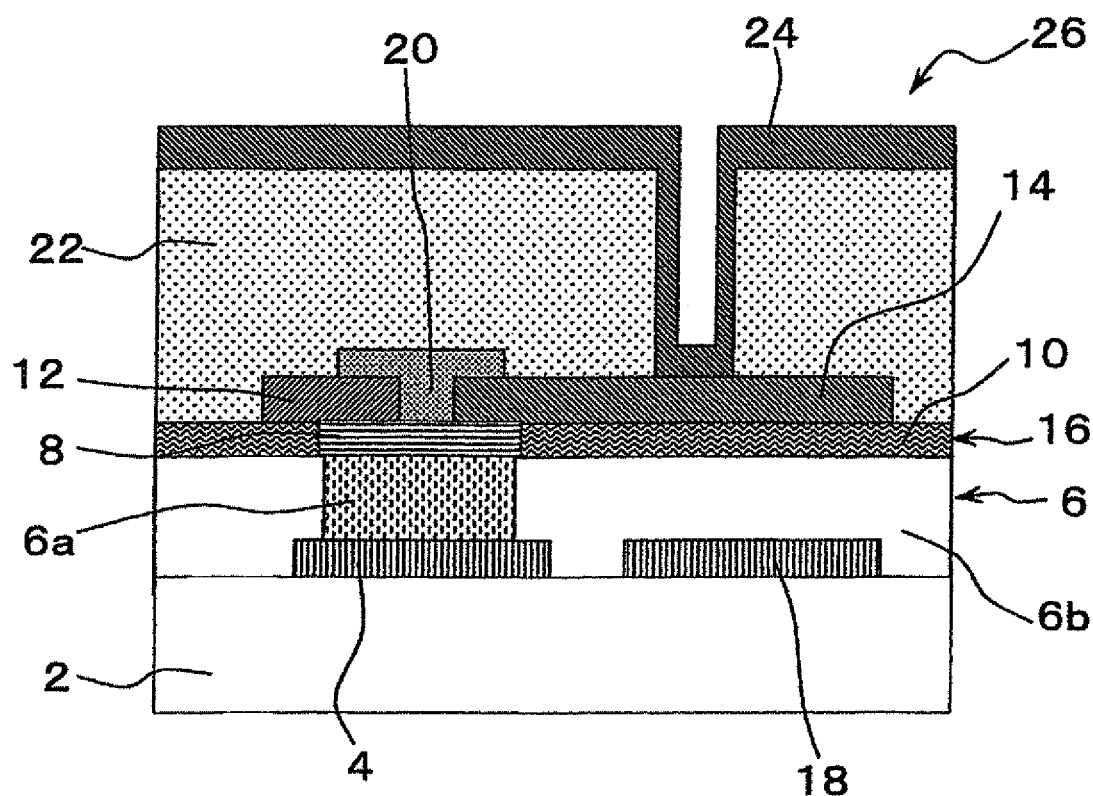
FIG. 3 is a cross sectional view schematically illustrating a thin film transistor according to a third example of the first embodiment of the present invention.
Figure 4:
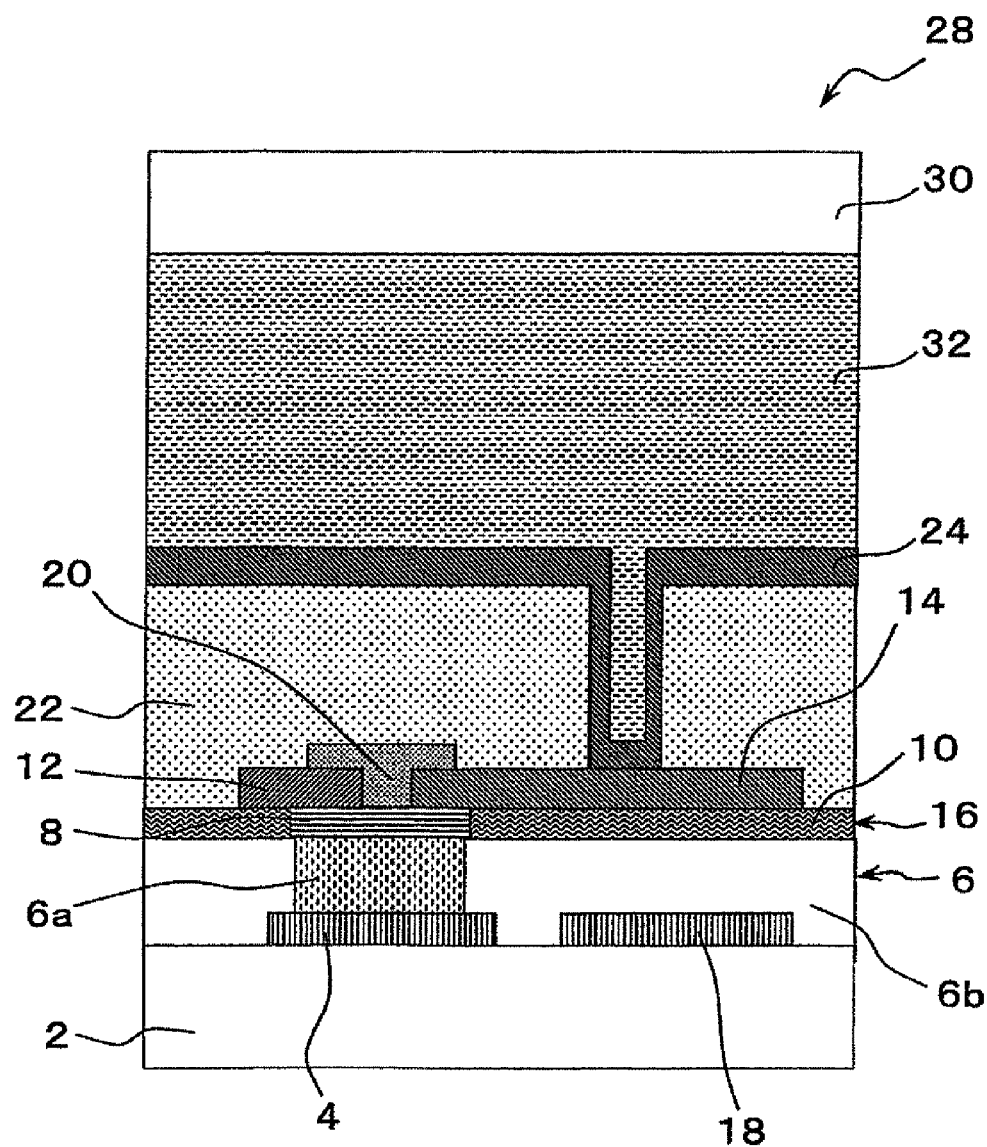
FIG. 4 is a cross sectional view schematically illustrating an image display device according to the third example of the first embodiment of the present invention.

The image display device according to the first embodiment, as its example is illustrated in FIGS. 3 and 4, is comprised of at least an interlayer insulating layer 22, a pixel electrode 24, an electrophoresis member 32, and an opposite electrode 30.

The interlayer insulating layer 22 is formed appropriately using dry deposition, such as vacuum deposition, ion plating, sputtering, laser ablation, plasma CVD, photo-assisted CVD, or hot-wire CVD, and/or wet deposition, such as spin coating, dip coating, or screen printing, according to its materials. The interlayer insulating layer 22 has an opening over the drain electrode 14, so that the drain electrode 14 and the pixel electrode 24 are connected to each other via the opening. The opening can be formed using a known method, such as photolithography or etching simultaneously with or after the formation of the interlayer insulating layer 180.

A conductive material is deposited on the interlayer insulating layer 22 as a film, and patterned to form the pixel electrode 24 having a predetermined pixel shape. Forming the pixel electrode 24 on the interlayer insulating layer 22 in which the opening has been formed such that the drain electrode 14 is exposed permits the drain electrode 14 and the pixel electrode 24 to be electrically connected to each other.

The opposite electrode 30 is mounted on the electrophoresis member 32 formed on the pixel electrode 24. The electrophoresis member 32 is an image display medium using electrophoresis. As patterning of each electrode and the insulating protective layer, an available known method can be used. For example, photolithography can be used, which protects the patterned portions using a resist, and eliminates unwanted parts by etching. Patterning is not limited to photolithography.

Effect of the First Embodiment

Effects of the first embodiment will be listed hereinafter.

The thin film transistor 1 according to the first embodiment and the method of manufacturing the thin film transistor 1 enable a patterning process of the metal oxide layer 16, i.e. a wet etching process, to be eliminated. This makes it possible to simplify the manufacturing processes of the thin film transistor 1.

This provides the thin film transistor 1 manufacturable in high quality and low cost and the method of manufacturing the thin film transistor 1, and the image display device equipped with the thin film transistor 1.

Second Embodiment

The structure of a thin film transistor, that of an image display equipped with the thin film transistor, and the method of manufacturing the thin film transistor according to the second embodiment of the present invention will be described with reference to the drawings.

(Structure)

The structure of the thin film transistor according to the second embodiment will be described with reference to FIG. 6.

Figure 6:
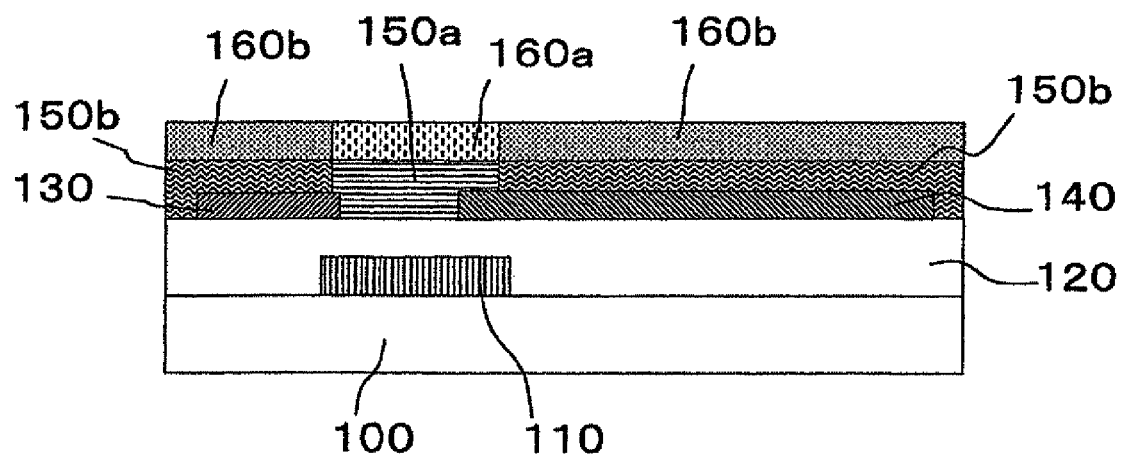
FIG. 6 is a schematic cross sectional view illustrating a thin film transistor according to a second embodiment of the present invention.

Referring to FIG. 6, the thin film transistor includes, in sequence, an insulating substrate 100, a gate electrode 110; a gate insulating layer 120; a source electrode 130; a drain electrode 140; a metal oxide layer 150; and an insulating protective layer 160. That is, the thin film transistor is designed as a bottom-gate bottom-contact thin film transistor.

The insulating protective layer 160 is composed of a first insulating protective layer 160a and a second insulating protective layer 160b, and the metal oxide layer 150 is composed of a semiconductor region 150a formed below the first insulating protective layer 160a and an insulating region 150b formed below the second insulating protective layer 160b. The first insulating protective layer 160a abutting on the semiconductor region 150a including a channel is made from silicon nitride deposited by CVD.

As a material of the insulating substrate according to the second embodiment, for example, a glass or plastic substrate can be used.

As a plastic substrate, for example, poly methyl methacrylate, polyacrylate, polycarbonate, polystyrene, polyethylene sulfide, polyethersulfone, polyolefin, polyethylene terephthalate, polyethylene naphthalate, cycloolefin polymer, polyethersulfone, triacetylcellulose, polyvinyl fluoride film, ethylene-tetrafluoroethylene copolymer resin, weather-resistance polyethylene terephthalate, weather-resistance polypropylene, glass-fiber reinforced acrylic resin film, glass-fiber reinforced polycarbonate, transparent polyimide, fluorine-based resin, cyclic polyolefin resin, and so on can be used.

However, the present invention is not limited to these substrates. A single substrate in these substrates can be used, and a composite substrate formed by laminating two or more substrates can be used. A substrate on which a resin layer, such as a color filter, is formed can be laminated on a glass or plastic substrate.

As a material of each of the gate electrode 110, source electrode 130, and drain electrode 140, oxide materials, such as indium oxide ($In_2O_3$), tin oxide ($SnO_2$), zinc oxide (ZnO), cadmium oxide (CdO), indium cadmium oxide ($CdIn_2O_4$), cadmium tin oxide ($Cd_2SnO_4$), zinc tin oxide ($Zn_2SnO_4$), or indium zinc oxide (In—Zn—O) can be preferably used.

As a material of each of the gate electrode 110, source electrode 130, and drain electrode 140, using, for example, impurity-doped oxide materials set forth above is preferable. For example, molybdenum-doped indium oxide, titanium-doped indium oxide, antimony-doped tin oxide, fluorine-doped tin oxide, indium-doped zinc oxide, aluminum-doped zinc oxide, gallium-doped zinc oxide, or other similar doped oxide materials can be used. In these doped oxide materials, tin-doped indium oxide, called ITO, is particularly suitable because of its low resistivity.

As a material of each of the gate electrode 110, source electrode 130, and drain electrode 140, using, for example, a low-resistance metal material, such as Au, Ag, Cu, Cr, Al, Mg, or Li, is suitable.

As a material of each of the gate electrode 110, source electrode 130, and drain electrode 140, using an organic conductive material, such as polyethylenedioxythiophene (PEDOT), is suitable. A single layer made from an organic conductive material or plural layers of an organic conductive material and a conductive oxide material can be used as a material of each of the gate electrode 110, source electrode 130, and drain electrode 140.

The same material can be used for the gate electrode 110, the source electrode 130, and the drain electrode 140. Different materials can also be used for the gate electrode 110, the source electrode 130, and the drain electrode 140. However, the same material is preferably used for the source electrode 130 and the drain electrode 140 for the purpose of reducing the number of manufacturing processes.

Each of the gate electrode 110, the source electrode 130, and the drain electrode 140 can be formed by vacuum deposition, ion plating, sputtering, laser ablation, plasma CVD, photo-assisted CVD, or hot-wire CVD. As the method of forming each of the gate electrode 110, the source electrode 130, and the drain electrode 140, for example, an aforementioned conductive material in the form of a paste or an ink is applied by screen printing, letterpress printing, intaglio printing, reverse offset printing, ink jet, or the like, and fired to be formed as a corresponding one of the electrodes. However, a method of forming each of the gate electrode 110, the source electrode 130, and the drain electrode 140 is not limited to the aforementioned methods.

An insulating film forming the gate insulating layer 120 according to the second embodiment can be made from an inorganic material, such as silicon oxide, silicon nitride, silicon oxynitride, aluminum oxide, tantalum oxide, yttrium oxide, hafnium oxide, hafnium aluminate, zirconium oxide, or titanium oxide. An insulating film forming the gate insulating layer 120 according to the second embodiment can be made from polyacrylate, such as polymethyl methacrylate (PMMA), polyvinyl alcohol (PVA), polyvinyl phenol (PVP), or the like. However, the present invention is not limited to these materials. The resistivity of an insulating material is preferably set to be equal to or higher than $10^{11}$ Ω·cm, more preferably to be equal to or higher than $10^{12}$ Ω·cm.

The semiconductor region 150a and the insulating region 150b constituting the metal oxide layer 150 according to the second embodiment are simultaneously deposited to exist in the film of the single layer. As an example of components of the metal oxide layer 150, an oxide including any one of the following elements zinc, indium, tin, tungsten, magnesium, and gallium can be used. As an example of such an oxide, known materials including zinc oxide, indium oxide, indium zinc oxide, tin oxide, tungsten oxide, indium-gallium-zinc oxide (In—Ga—Zn—O) can be used. However, the present invention is not limited to these materials. The film thickness of the metal oxide layer is preferably set to be equal to or higher than 10 nm. This is because, if the film thickness of the metal oxide layer were lower than 10 nm, it could be difficult to form a uniform semiconductor layer in the entire film.

The metal oxide layer 150 can be formed by sputtering, pulse-laser deposition, vacuum deposition, CVD, sol-gel process, or the like. Preferably, as a method of forming the metal oxide layer 150, sputtering, pulsed laser deposition, vacuum deposition, or CVD is used. As the sputtering, RF magnetron sputtering, DC sputtering, or ion beam sputtering is suitable. As the vacuum deposition, heating deposition, electron-beam deposition, or ion plating can be used. As the CVD, hot-wire CVD or plasma CVD is suitable.

Note that a method of forming the metal oxide layer is not limited to the aforementioned methods.

The insulating protective layer 160 according to the second embodiment is composed of the first insulating protective layer 160a and the second insulating protective layer 160b. The insulating protective layer 160 preferably has a thickness within the range from 30 nm to 500 nm inclusive. If the insulating protective layer 160 had a thickness lower than 30 nm, it could have insufficient voltage endurance. If the insulating protective layer 160 had a thickness higher than 500 nm, the productivity could be reduced.

The concentration of hydrogen atoms contained in the first insulating protective layer 6a is set to be within the range from $1\times10^{20}/cm^3$ to $5\times10^{22}/cm^3$ inclusive. The concentration of hydrogen atoms contained in the second insulating protective layer 6b is set to be lower than $1\times10^{20}/cm^3$.

Because the insulating protective layer includes a lot of hydrogen atoms, the hydrogen atoms are likely to diffuse into the semiconductor region as the metal, oxide layer formed on the insulating protective layer. Thus, the diffused hydrogen atoms act as P-type dopants in the metal oxide layer to increase the electric conductivity of the semiconductor layer as the metal oxide layer.

If the concentration of the hydrogen atoms included in the first insulating protective layer 160a were lower than $1\times10^{20}/cm^3$, a low amount of hydrogen atoms, which diffuse into the metal oxide layer, could not contribute to an increase of the electric conductivity of the metal oxide layer. This could make it difficult for the semiconductor region formed on the insulating protective layer 160a to serve as a semiconductor layer.

In the second embodiment, the insulating protective layer 160a is made from a material deposited by CVD as described later. For this reason, the hydrogen atoms included in the insulating protective layer 160a is derived from $NH_3$ gas normally used as source gas.

Thus, if the concentration of the hydrogen atoms included in the first insulating protective layer 160a were higher than $5\times10^{22}/cm^3$, the concentration of $NH_3$ gas as that of the source gas could be excessively high. This could make it difficult to form an SiN film, resulting in a difficulty depositing the insulating protective layer using CVD.

The concentration of hydrogen atoms contained in the second insulating protective layer 160b is set to be lower than $1\times10^{20}/cm^3$.

The reason why the concentration of hydrogen atoms contained in the second insulating protective layer 160b is set to be lower than $1\times10^{20}/cm^3$ is to permit the electric conductivity of the metal oxide layer formed below the first insulating protective layer 160a to be higher than that of the metal oxide layer formed below the second insulating protective layer 160b. This allows the second insulating protective layer 160b to insulate metal-oxide semiconductor layers adjacent to each other of the TFT.

If the concentration of the hydrogen atoms included in the second insulating protective layer 160b were equal to or higher than $10^{20}/cm^3$, the hydrogen atoms included in the second insulating protective layer 160b could diffuse into the insulating region 150b as a metal oxide layer below the second insulating protective layer 160b. This could increase the electric conductivity of the insulating region 10 as a metal oxide layer below the second insulating protective layer 160b, resulting in the normal activity of the insulating region 150b becoming weak.

The first insulating protective layer 160a is formed by silicon nitride deposited by CVD or the like, but it is not limited thereto. As a starting material of silicon nitride deposited by CVD, $SiH_4/NH_3$ or the like is used.

As a material of the second insulating protective layer 160b, a silicon oxide, silicon nitride, silicon oxynitride, or aluminum oxide is particularly suitable.

In addition, tantalum oxide, yttrium oxide, hafnium oxide, hafnium aluminate, zirconium oxide, titanium oxide, or the like can be used as a material of the second insulating protective layer 160b. Using one of these materials for the second insulating protective layer 160b can achieve sufficient performance as the protective layer. The second insulating protective layer 160b can be preferably formed by sputtering, plasma CVD, or atomic deposition, but vacuum deposition, ion plating, laser ablation, or another method can be used as a method of forming the second insulating protective layer 160b.

Figure 8:
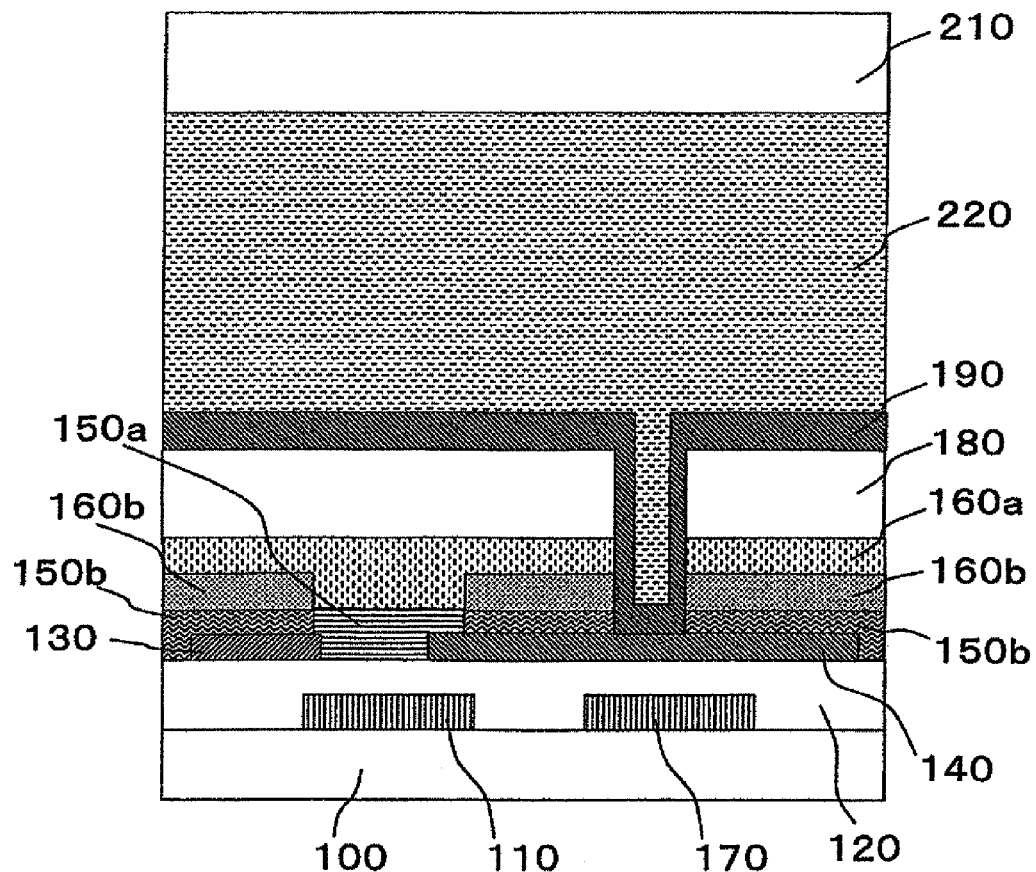
FIG. 8 is a schematic cross sectional view illustrating one pixel of an image display device according to each of the fourth example, fifth example, sixth example, and second comparative example of the second embodiment of the present invention.
Figure 10:
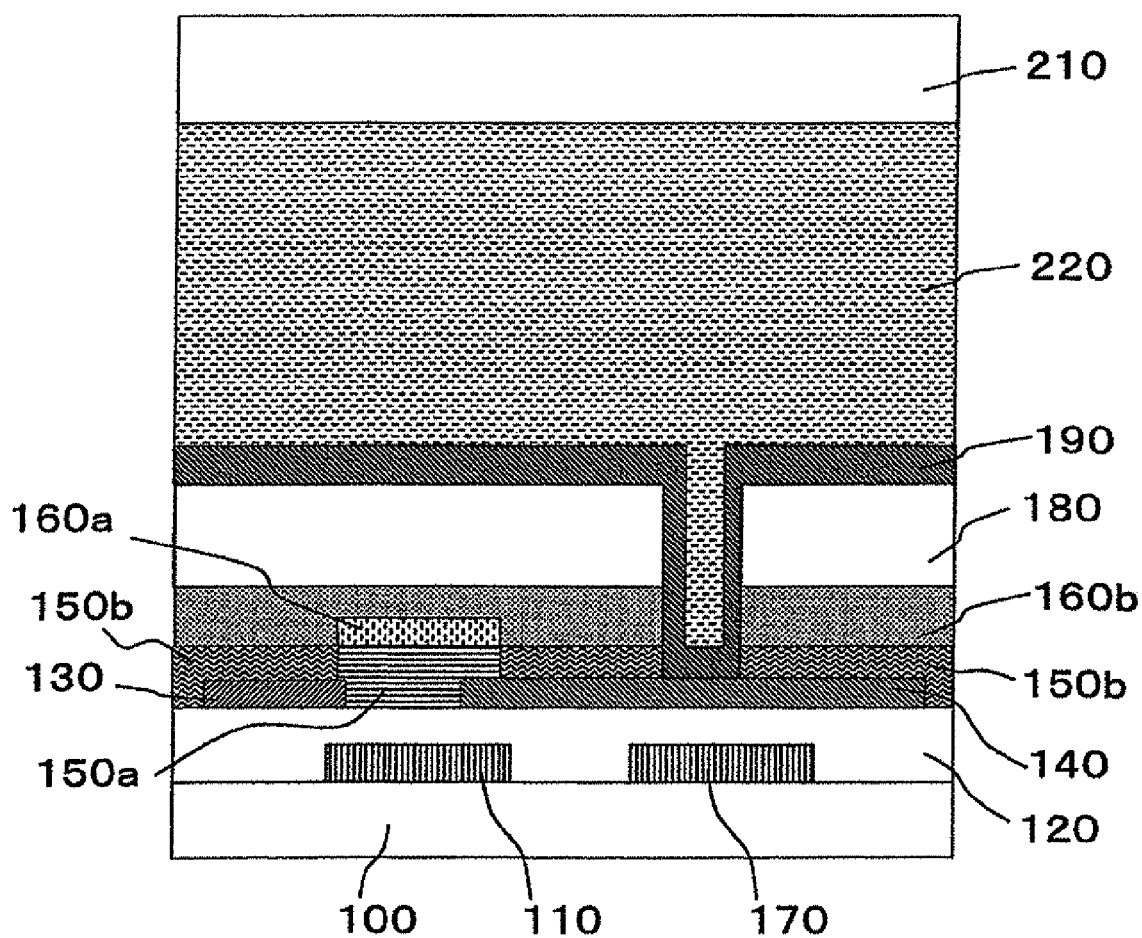
FIG. 10 is a schematic cross sectional view illustrating one pixel of an image display device according to each of the fifth example and fifth comparative example of the second embodiment of the present invention.

The image display device according to the second embodiment, as its example is illustrated in FIG. 8 or FIG. 10, is comprised of at least an interlayer insulating layer 180, a pixel electrode 190, an electrophoresis member 220, and an opposite electrode 210.

The interlayer insulating layer 180 is formed appropriately using dry deposition, such as vacuum deposition, ion plating, sputtering, laser ablation, plasma CVD, photo-assisted CVD, or hot-wire CVD, and/or wet deposition, such as spin coating, dip coating, or screen printing, according to its materials. The interlayer insulating layer 180 has an opening over the drain electrode 140, so that the drain electrode 140 and the pixel electrode 190 are connected to each other via the opening. The opening can be formed using a known method, such as photolithography or etching simultaneously with or after the formation of the interlayer insulating layer 180.

A conductive material is deposited on the interlayer insulating layer 180 as a film, and patterned to for the pixel electrode 190 having a predetermined pixel shape. Forming the pixel electrode 190 on the interlayer insulating layer 180 in which the opening has been formed such that the drain electrode 140 is exposed permits the drain electrode 140 and the pixel electrode 190 to be electrically connected to each other.

The opposite electrode 210 is mounted on the electrophoresis member 220 formed on the pixel electrode 190. The electrophoresis member 220 is an image display medium using electrophoresis. As patterning of each electrode and the insulating protective layer, an available known method can be used. For example, photolithography can be used, which protects the patterned portions using a resist, and eliminates unwanted parts by etching. Patterning is not limited to photolithography.

Effect of the Second Embodiment

Effects of the second embodiment will be listed hereinafter.

The thin film transistor according to the second embodiment and the method of manufacturing the thin film transistor enable a patterning process of the metal oxide layer 150, i.e. a wet etching process, to be eliminated. This makes it possible to simplify the manufacturing processes of the thin film transistor.

This provides the thin film transistor manufacturable in high quality and low cost and the method of manufacturing the thin film transistor, and the image display device equipped with the thin film transistor.

Modification

Modifications of the first embodiment and the second embodiment will be listed hereinafter.

In each of the thin film transistors according to the first and second embodiments, the electric conductivity of the semiconductor region is set to be within the range from $10^{-7}$ S/cm to $10^{-3}$ S/cm inclusive, and the electric conductivity of the insulating region is set to be lower than $10^{-7}$ S/cm. However, the electric conductivity of the semiconductor region and that of the insulating region is not limited to values set forth above.

In each of the thin film transistors according to the first and second embodiments, a material including one of indium, zinc, and gallium is used as a material of the metal oxide layer, but the structure of the metal oxide layer is not limited thereto.

In each of the thin film transistors according to the first and second embodiments, a resin substrate is used as the insulating substrate 2, but the structure of the insulating layer is not limited thereto.

In the method of manufacturing a thin film transistor according to the first embodiment, the second gate insulating layer 6b is formed based on silicon oxide deposited by CVD, but is not limited thereto. The second gate insulating layer 6b can be formed based on one or more materials other than silicon oxide deposited by CVD. In the method of manufacturing a thin film transistor according to the first embodiment, the second gate insulating layer 6b is formed as a layer including any one of silicon oxide, silicon nitride, silicon oxynitride, or aluminum oxide, but is not limited thereto. The second gate insulating layer 6b can be formed as a layer that does not include these compounds.

In the method of manufacturing a thin film transistor according to the second embodiment, the second insulating protective layer is for formed based on silicon oxide deposited by CVD, but is not limited thereto. The second insulating protective layer can be formed based on one or more materials other than silicon oxide deposited by CVD. In the method of manufacturing a thin film transistor according to the second embodiment, the second insulating protective layer is formed as a layer including any one of silicon oxide, silicon nitride, silicon oxynitride, or aluminum oxide, but is not limited thereto. The second insulating protective layer can be formed as a layer that does not include these compounds.

The thin film transistor according to the first embodiment is designed as a bottom-gate top-contact thin film transistor, and the thin film transistor according to the second embodiment is designed as a bottom-gate bottom-contact thin film transistor, but they are not limited thereto. They are designed such that a gate insulating layer or an insulating protective layer causes a metal oxide layer to have a semiconductor region and an insulating region. Each of them can be designed as a top-gate bottom contact thin film transistor in which an insulating layer, source drain electrodes, a metal oxide layer, and a gate electrode are stacked in sequence Each of them also can be designed as a top gate top contact thin film transistor in which an insulating layer, an insulating protective layer, a metal oxide layer, source and drain electrodes, a gate insulating layer, and a gate electrode are stacked in sequence.

The image display medium of the image display device equipped with the thin film transistor according to each of the first and second embodiments is an electrophoresis display medium, but is not limited thereto. As the image display medium, a display medium other than such electrophoresis display media can be used.

EXAMPLES

Examples of the present invention will be described hereinafter using comparative examples.

Examples of the First Embodiment

Three types of thin film transistors 1 according to the first embodiment were manufactured, three types of thin film transistors 1 according to the comparative examples were manufactured, and the physical properties of each of these manufactured thin film transistors 1 were evaluated based on FIGS. 2 to 5 in reference to FIG. 1. The results of the physical property evaluation will be described hereinafter.

First Example

Figure 2:
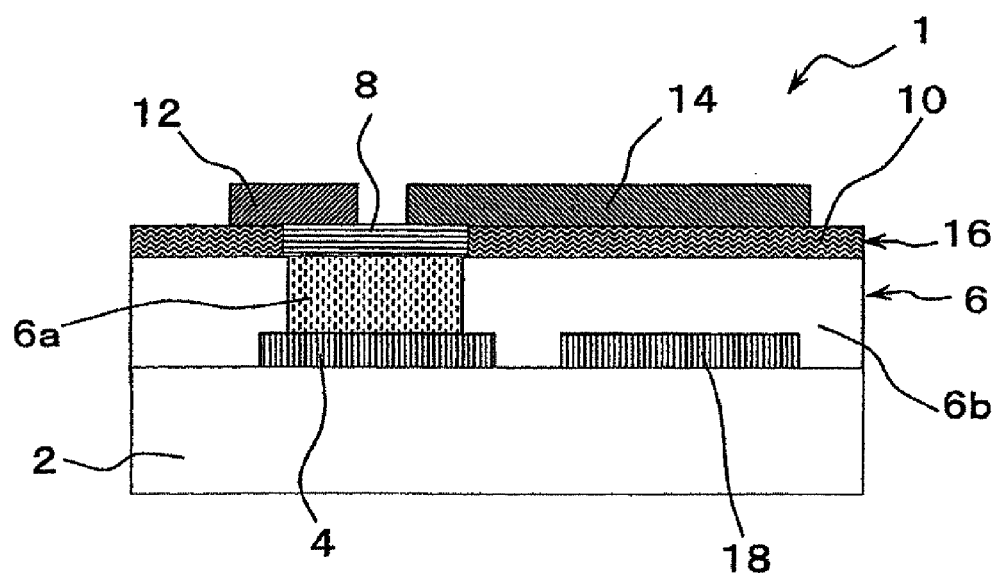
FIG. 2 is a cross sectional view schematically illustrating a thin film transistor according to each of a first example, a second example, and a second comparative example of the first embodiment of the present invention.

The thin film transistor 1, i.e. the thin film transistor element, illustrated in FIG. 2 was manufactured as the thin film transistor 1 according to the first example. Note that FIG. 2 is a cross sectional view of schematically illustrating the thin film transistor 1 according to this example.

In manufacturing the thin film transistor 1 according to the first example, an Mo film was deposited to have a thickness of 80 nm on a PEN substrate with a thickness of 125 μm at room temperature using a DC magnetron sputtering system.

Next, after formation of a resist pattern using photolithography, dry etching and stripping were performed, so that the gate electrode 4 and a capacitor electrode 18 were formed.

At that time, input power, gas flow rate Ar, and deposition pressure during Mo-film formation were set to 100 W, 50 SCCM, and 1.0 Pa, respectively.

Next, an SiNx film was deposited to have a thickness of 500 nm using a plasma CVD system. After formation of a resist pattern using photolithography, dry etching and stripping were performed, so that the first gate insulating layer 6a was formed.

At that time, the deposition of the SiNx film was performed based on the following conditions: $SiH_4$ gas with gas flow rate of 10 SCCM and $NH_3$ gas with flow rate of 5 SCCM were used as source gas, input power, deposition pressure, and substrate temperature were set to 200 W, 3 Pa, and 150° C., respectively.

Next, a SiOx film was deposited to have a thickness of 500 nm using a plasma CVD system. After formation of a resist pattern using photolithography, dry etching and stripping were performed, so that the second gate insulating layer 6b was formed.

At that time, the deposition of the SiOx film was performed based on the following conditions: $SiH_4$ gas with gas flow rate of 10 SCCM and $N_2O$ gas with flow rate of 10 SCCM were used as source gas, input power, deposition pressure, and substrate temperature were set to 300 W, 1 Pa, and 150° C., respectively.

Next, a metal oxide layer 16 composed of InGaZnO was deposited with a film thickness of 40 nm at room temperature using sputtering.

At that time, input power, gas flow rate Ar, gas flow rate $O_2$, and deposition pressure during deposition of the metal oxide film were set to 100 W, 100 SCCM, 2 SCCM, and 1.0 Pa, respectively.

Finally, an Mo film was deposited to have a thickness of 80 nm at room temperature using a DC magnetron sputtering system. After formation of a resist pattern using photolithography, dry etching and stripping were performed, so that the source electrode 12 and the drain electrode 14 were formed. As a result, the thin film transistor 1 according to the first example was obtained.

The length of the channel between the source electrode 12 and the drain electrode 14 is set to 20 μm, and the width of the channel therebetween is set to 5 μm.

The concentration of hydrogen atoms contained in the first gate insulating layer 6a of the thin film transistor 1 of the first example manufactured set forth above, which was measured using an SIMS (Secondary Ion Mass Spectrometry) system, was $5.2 \times 10^{21}/cm^3$. The concentration of hydrogen atoms contained in the second gate insulating layer 6b of the thin film transistor 1 of the first example manufactured set forth above, which was measured using the SIMS system, was $9.0 \times 10^{19}/cm^3$.

The electric conductivity of the semiconductor region 8 of the metal oxide layer 16 of the thin film transistor 1, which was measured using a semiconductor parameter analyzer, was $1.7 \times 10^{-4}$ Scm. The electric conductivity of the insulating region 10 of the thin film transistor 1, which was measured using the semiconductor parameter analyzer, was $9.0 \times 10^{-10}$ Scm.

The thin film transistor 1 has a mobility of 11 $cm^2$/Vs, an ON/OFF ratio of five-digit numbers upon a voltage of 10 V being applied across the source electrode 12 and the drain electrode 14, and a subthreshold swing value, i.e. an S value, of 1.1 V/decade.

The measured results demonstrate that the thin film transistor 1 according to the first example exhibits good transistor characteristics.

Next, using the same method as the aforementioned method, a sealing layer 20 made from SiOx, the interlayer insulating layer 22 made from polymer, and the pixel electrode 24 made from ITO were deposited on the source electrode 12 and the drain electrode 14 formed on the thin film transistor 1, so that a thin film transistor array substrate 26, i.e. a thin film transistor array, was obtained. Note that FIG. 3 is a cross sectional view schematically illustrating the thin film transistor array substrate 26 according to this example.

The thin film transistor array substrate 26 has 480×640 pixels each having the size of 125 μm×125 μm.

Next, the image display device 28 as illustrated in FIG. 4 was produced by sandwiching the electrophoresis member 32 between the thin film transistor array substrate 26 and the opposite electrode 30. When the image display device 28 was driven, it was ensured that the image display device 28 was capable of good displays. Note that FIG. 4 is a cross sectional view schematically illustrating the image display device 28 according to this example.

Second Example

The thin film transistor 1 according to the second example, the structure of which is illustrated in FIG. 2, was manufactured in the same approach as that according to the first example except that the SiNx film was deposited as the second gate insulating layer 6b by a sputtering device. At that time, input power, gas flow rate Ar, and deposition pressure during SiNx-film formation were set to 500 W, 50 SCCM, and 1.0 Pa, respectively.

The concentration of hydrogen atoms contained in the first gate insulating layer 6a of the thin film transistor 1 of the second example manufactured set forth above, which was measured using an SIMS system, was $5.1 \times 10^{21}/cm^3$. The concentration of hydrogen atoms contained in the second gate insulating layer 6b of the thin film transistor 1 of the second example manufactured set forth above, which was measured using the SIMS system, was $8.1 \times 10^{19}/cm^3$.

The electric conductivity of the semiconductor region 8 of the metal oxide layer 16 of the thin film transistor 1, which was measured using a semiconductor parameter analyzer, was $1.1 \times 10^{-4}$ Scm. The electric conductivity of the insulating region 10 of the thin film transistor 1, which was measured using the semiconductor parameter analyzer, was $5.5 \times 10^{-10}$ Scm.

The thin film transistor 1 has a mobility of 9 $cm^2$/Vs, an ON/OFF ratio of six-digit numbers upon a voltage of 10 V being applied across the source electrode 12 and the drain electrode 14, and a subthreshold swing value, i.e. an S value, of 0.9 V/decade.

The measured results demonstrate that the thin film transistor 1 according to the second example exhibits good transistor characteristics.

Next, using the same method as the aforementioned method, a sealing layer 20 made from SiOx, the interlayer insulating layer 22 made from polymer, and the pixel electrode 24 made from ITO were deposited on the source electrode 12 and the drain electrode 14 formed on the thin film transistor 1 as illustrated in FIG. 3, so that a thin film transistor array substrate 26 was obtained.

The film transistor substrate 26 has 480×640 pixels each having the size of 125 μm×125 μm.

Next, the image display device 28 as illustrated in FIG. 4 was produced by sandwiching the electrophoresis member 32 between the thin film transistor array substrate 26 and the opposite electrode 30. When the image display device 28 was driven, it was ensured that the image display device 28 was capable of good displays.

Third Example

The thin film transistor 1 according to the third example, the structure of which is illustrated in FIG. 2, was manufactured in the same approach as that according to the first example except that an $Al_2O_3$ film was deposited as the second gate insulating layer 6b by an atomic layer deposition system. At that time, the $Al_2O_3$ film was deposited using trimethyl aluminum and $H_2O$ while the temperature of the substrate was set to 150° C.

The concentration of hydrogen atoms contained in the first gate insulating layer 6a of the thin film transistor 1 of the third example manufactured set forth above, which was measured using an SIMS system, was $5.0 \times 10^{21}/cm^3$. The concentration of hydrogen atoms contained in the second gate insulating layer 6b of the thin film transistor 1 of the third example manufactured set forth above, which was measured using the SIMS system, was $4.0 \times 10^{19}/cm^3$.

The electric conductivity of the semiconductor region 8 of the metal oxide layer 16 of the thin film transistor 1, which was measured using a semiconductor parameter analyzer, was $1.2 \times 10^{-4}$ Scm. The electric conductivity of the insulating region 10 of the thin film transistor 1, which was measured using the semiconductor parameter analyzer, was $3.1 \times 10^{-10}$ Scm.

The thin film transistor 1 has a mobility of 10 $cm^2/Vs$, an ON/OFF ratio of six-digit numbers upon a voltage of 10 V being applied across the source electrode 12 and the drain electrode 14, and a subthreshold swing value, i.e. an S value, of 0.9 V/decade.

The measured results demonstrate that the thin film transistor 1 according to the third example exhibits good transistor characteristics.

Next, using the same method as the aforementioned method, a sealing layer 20 made from SiOx, the interlayer insulating layer 22 made from polymer, and the pixel electrode 24 made from ITO were deposited on the source electrode 12 and the drain electrode 14 formed on the thin film transistor 1 as illustrated in FIG. 3, so that a thin film transistor array substrate 26 was obtained.

The film transistor substrate 26 has 480×640 pixels each having the size of 125 μm×125 μm.

Next, the image display device 28 as illustrated in FIG. 4 was produced by sandwiching the electrophoresis member 32 between the thin film transistor array substrate 26 and the opposite electrode 30. When the image display device 28 was driven, it was ensured that the image display device 28 was capable of good displays.

First Comparative Example

Figure 5:
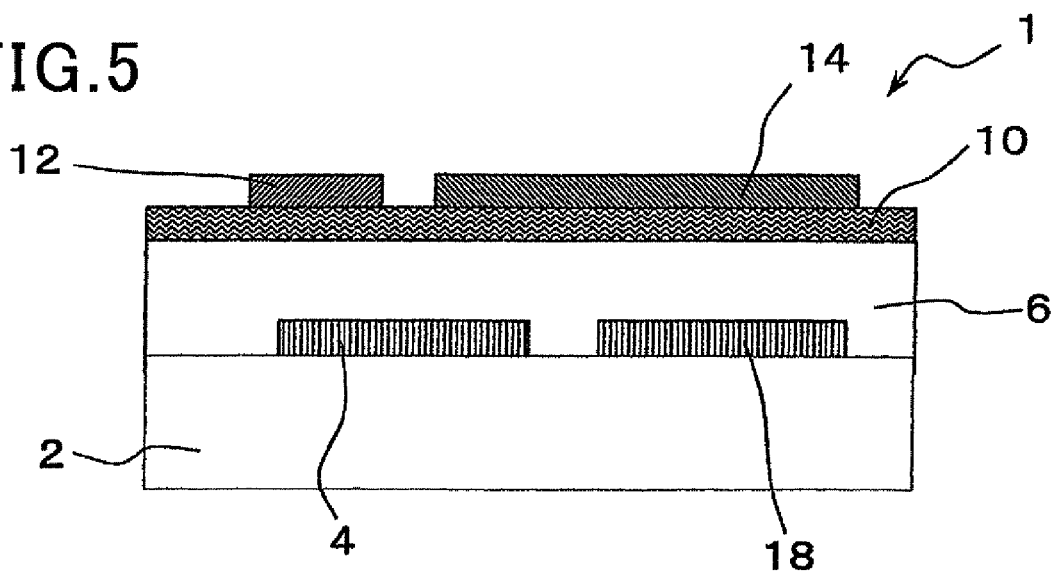
FIG. 5 is a cross sectional view schematically illustrating a thin film transistor according to each of first and third comparative examples of the first embodiment of the present invention.

A thin film transistor 1 according to the first comparative example, the structure of which is illustrated in FIG. 5, was manufactured in the same approach as that according to the first example except that: the gate insulating layer 6 was formed in the same conditions as the second gate insulating layer 6b; and the metal oxide layer 16 was formed in the same conditions as the semiconductor region 8. Note that FIG. 5 is a cross sectional view schematically illustrating the thin film transistor according to this example.

The concentration of hydrogen atoms contained in the gate insulating layer 6 of the thin film transistor 1 of the first comparative example manufactured set forth above, which was measured using an SIMS system, was $9.2 \times 10^{19}/cm^3$.

The electric conductivity of the metal oxide layer 16 of the thin film transistor 1, which was measured using a semiconductor parameter analyzer, was $9.1 \times 10^{-10}$ Scm.

Measured results of the characteristics of the thin film transistor 1 demonstrate that the level of on-state current of the thin film transistor 1 is low.

The measured results demonstrate that the thin film transistor 1 according to the first comparative example does not obtain good transistor characteristics.

Second Comparative Example

A thin film transistor 1 according to the second comparative example, the structure of which is illustrated in FIG. 2, was manufactured in the same approach as that according to the first example except that heating temperature of the substrate during deposition of the first gate insulating layer 6a was set to 80° C.

The concentration of hydrogen atoms contained in the first gate insulating layer 6a of the thin film transistor 1 of the second comparative example manufactured set forth above, which was measured using an SIMS system, was $6.0 \times 10^{22}/cm^3$. The concentration of hydrogen atoms contained in the second gate insulating layer 6b of the thin film transistor 1 of the second comparative example manufactured set forth above, which was measured using the SIMS system, was $9.0 \times 10^{19}/cm^3$.

The electric conductivity of the metal oxide layer 16 of the thin film transistor 1, which was measured using a semiconductor parameter analyzer, was $5.3 \times 10^{-2}$ Scm, and the electric conductivity of the insulating layer 10 of the thin film transistor 1, which was measured using a semiconductor parameter analyzer, was $8.9 \times 10^{-10}$ Scm.

Measured results of the characteristics of the thin film transistor 1 demonstrate that the level of on-state current of the thin film transistor 1 is low, so that it was found that the thin film transistor 1 according to the second comparative example does not obtain good transistor characteristics.

Third Comparative Example

A thin film transistor 1 according to the third comparative example, the structure of which is illustrated in FIG. 5, was manufactured in the same approach as that according to the first example except that: the gate insulating layer 6 was formed in the same conditions as the first gate insulating layer 6a; and the metal oxide layer 16 was formed in the same conditions as the semiconductor region 8.

The concentration of hydrogen atoms contained in the gate insulating layer 6 of the thin film transistor 1 of the first comparative example manufactured set forth above, which was measured using an SIMS system, was $5.1 \times 10^{21}/cm^3$.

The electric conductivity of the metal oxide layer 16 of the thin film transistor 1, which was measured using a semiconductor parameter analyzer, was $1.9 \times 10^{-4}$ Scm.

The thin film transistor 1 has a mobility of 10 $cm^2/Vs$, an ON/OFF ratio of five-digit numbers upon a voltage of 10 V being applied across the source electrode 12 and the drain electrode 14, and a subthreshold swing value, i.e. an S value, of 1.2 V/decade.

The measured results demonstrate that the thin film transistor 1 according to the third comparative example exhibits good transistor characteristics.

Next, using the same method as the aforementioned method, a sealing layer 20 made from SiOx, the interlayer insulating layer 22 made from polymer, and the pixel electrode 24 made from ITO were deposited on the source electrode 12 and the drain electrode 14 formed on the thin film transistor 1 as illustrated in FIG. 3, so that a thin film transistor array substrate 26 was obtained.

The thin film transistor substrate 26 has 480×640 pixels each having the size of 125 μm×125 μm.

Next, the image display device 28 as illustrated in FIG. 4 was produced by sandwiching the electrophoresis member 32 between the thin film transistor array substrate 26 and the opposite electrode 30. When the image display device 28 was driven, it was ensured that the image display device 28 was incapable of good displays due to electrical interaction between adjacent pixels.

Examples of the Second Embodiment

Four types of thin film transistors 1 according to the second embodiment were manufactured, two types of thin film transistors 1 according to the comparative examples were manufactured, and physical property evaluation of each of these manufactured thin film transistors 1 was performed based on FIGS. 7 to 10 in reference to FIG. 6. The results of the physical property evaluation will be described hereinafter.

Fourth Example

Figure 7:
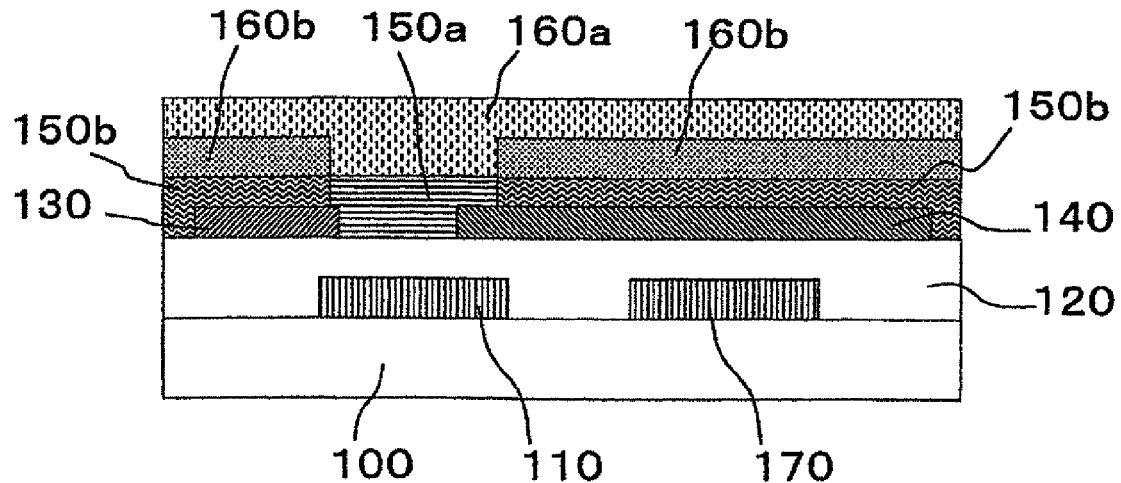
FIG. 7 is a schematic cross sectional view illustrating a thin film transistor according to each of a fourth example, a fifth example, a sixth example, and the second comparative example of the second embodiment of the present invention.

In the fourth example, the thin film transistor element illustrated in FIG. 7, and the image display device illustrated in FIG. 8 were manufactured.

How to manufacture the thin film transistor element according to the fourth example will be described as follows.

A washed PEN substrate with a thickness of 125 μm was used as the insulating substrate 100. On the insulating substrate 100, an Mo film was deposited to have a thickness of 100 nm. Next, the gate electrode 110 and a capacitor electrode 170 were formed using photolithography. Input power, gas flow rate Ar, and deposition pressure during Mo-film formation were set to 100 W, 50 SCCM, and 1.0 Pa, respectively. In the photolithography process, after application of a photoresist on the Mo film, the Mo film was exposed to light via photo masks. Next, a resist pattern was formed using a developer, a gate pattern was formed by etching, and thereafter, stripping of the resist was performed. Next, a SiOx film was deposited to have a thickness of 500 nm using a plasma CVD system, resulting in the gate insulating film 120. At that time, the formation of the SiOx film was performed based on the following conditions: input power, $SiH_4$-gas flow rate, $NO_3$-gas flow rate, deposition pressure, and substrate temperature were set to 300 W, 10 SCCM, 10 SCCM, 1.0 Pa, and 150° C., respectively.

Next, an Mo film was deposited to have a thickness of 100 nm, and the source and drain electrodes 130 and 140 were formed using photolithography. The Mo deposition conditions and the photolithography were identical to those for deposition of the gate electrode 110. The length of the channel between the source electrode 12 and the drain electrode 14 was set to 20 μm, and the width of the channel therebetween was set to 5 μm. Next, the metal oxide layer 150 composed of InGaZnO was deposited as a film with a thickness of 40 nm at room temperature using sputtering. At that time, input power, gas flow rate Ar, gas flow rate $O_2$, and deposition pressure during deposition of InGaZnO were set to 300 W, 10 SCCM, 10 SCCM, and 1.0 Pa, respectively.

After formation of the film, a resist patter was formed using photolithography, and dry etching and stripping were performed, so that the insulating protective layer 160b was formed.

Finally, an SiNx film was deposited to have a thickness of 80 nm using a plasma CVD system as the insulating protective layer 160a, so that the thin film transistor element illustrated in FIG. 7 was obtained. Note that input power, $SiH_4$-gas flow rate, $NH_3$-gas flow rate, deposition pressure, and substrate temperature during formation of the SiNx film were set to 200 W, 10 SCCM, 5 SCCM, 3.0 Pa, and 150° C., respectively.

The concentration of hydrogen atoms contained in each of the insulating protective layers 160a and 160b of the thin film transistor element of the fourth example manufactured set forth above was measured using an SIMS system. As a result, the concentration of hydrogen atoms contained in the insulating protective layer 160a was $4.8 \times 10^{21}$/cm$^3$, and that of hydrogen atoms contained in the insulating protective layer 160b was $8.2 \times 10^{10}$/cm$^3$.

The electric conductivity of each of the semiconductor region 150a and the insulating region 150b of the metal oxide layer was measured using a semiconductor parameter analyzer. As a result, the electric conductivity of the semiconductor region 150a was $2.0 \times 10^{-4}$ Scm, and the electric conductivity of the insulating region 150b was $9.0 \times 10^{-10}$ Scm.

The manufactured thin film transistor element has a mobility of 9 cm$^2$/Vs, an ON/OFF ratio of five-digit numbers upon a voltage of 10 V being applied across the source electrode 12 and the drain electrode 14, and a subthreshold swing value, i.e. an S value, of 1.2 V/decade. The measured results demonstrate that the thin film transistor element exhibits good transistor characteristics.

How to manufacture the image display device according to the fourth example is as follows.

After the insulating protective layer of the thin film transistor element was formed in the same approach as the thin film transistor of the fourth example, the interlayer insulating layer 180 made from polymer was formed on the insulating protective layer, and vias were formed by dry etching. Thereafter, the pixel electrode 190 made from ITO was formed. 480×640 thin film transistors, each of which was formed with the insulating layer 180 set forth above and had the size of 125 μm×125 μm, were arranged to form a film transistor array substrate. Sandwiching the electrophoresis member 22 between the thin film transistor array substrate and the opposite electrode 210 produced the image display device according to the fourth example illustrated in FIG. 8. When the image display device according to the fourth example was driven, it was ensured that the image display device was capable of good displays.

Fifth Example

After the source electrode 130 and the drain electrode 140 were formed of the thin film transistor element according to the fifth example in the same approach as the thin film transistor of the fourth example, the metal oxide layer 150 composed of InGaZnO was deposited as a film with a thickness of 40 nm at room temperature using sputtering. At that time, input power, gas flow rate Ar, gas flow rate $O_2$, and deposition pressure during deposition of the InGaZnO were set to 100 W, 100 SCCM, 3 SCCM, and 1.0 Pa, respectively.

Next, the insulating protective layer 160a was formed using a liftoff process. After formation of a resist patter on the metal oxide layer 150, an SiNx film was deposited to have a thickness of 80 nm using a plasma CVD system. Note that input power, $SiH_4$-gas flow rate, $N_2O$ gas flow rate, deposition pressure, and substrate temperature during formation of the SiNx film were set to 300 W, 10 SCCM, 10 SCCM, 3.0 Pa, and 150° C., respectively.

After deposition of the film, stripping of the resist was performed, so that the insulating protective layer 160a was formed.

Figure 9:
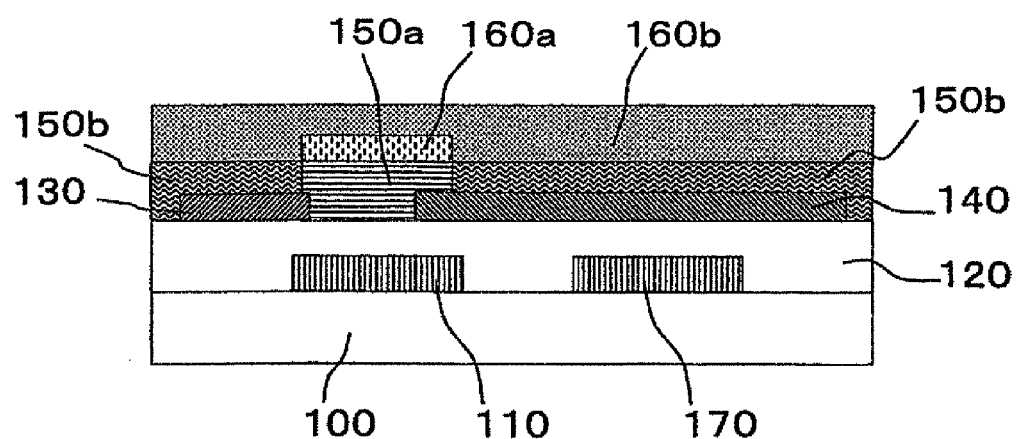
FIG. 9 is a schematic cross sectional view illustrating a thin film transistor according to each of a fifth example and a fifth comparative example of the second embodiment of the present invention.

Finally, an $SiO_2$ film was deposited to have a thickness of 80 nm using a plasma CVD system as the insulating protective layer 160b, so that the thin film transistor element illustrated in FIG. 9 was obtained. Note that input power, $SiH_4$-gas flow rate, $NH_3$-gas flow rate, deposition pressure, and substrate temperature during formation of the SiNx film were set to 200 W, 10 SCCM, 5 SCCM, 3.0 Pa, and 150° C., respectively.

The concentration of hydrogen atoms contained in each of the insulating protective layers 160a and 160b of the thin film transistor element of the fifth example manufactured set forth above was measured using an SIMS system. As a result, the concentration of hydrogen atoms contained in the insulating protective layer 160a was $4.7 \times 10^{21}$/cm$^3$, and that of hydrogen atoms contained in the insulating protective layer 160b was $8.0 \times 10^{19}$/cm$^3$.

The electric conductivity of each of the semiconductor region 150a and the insulating region 150b of the metal oxide layer was measured using a semiconductor parameter analyzer. As a result, the electric conductivity of the semiconductor region 150a was $2.4 \times 10^{-4}$ Scm, and the electric conductivity of the insulating region 150b was $5.0 \times 10^{-10}$ Scm.

The manufactured thin film transistor element has a mobility of 9 cm$^2$/Vs, an ON/OFF ratio of five-digit numbers upon a voltage of 10 V being applied across the source electrode 12 and the drain electrode 14, and a subthreshold swing value, i.e. an S value, of 0.9 V/decade. The measured results demonstrate that the thin film transistor element exhibits good transistor characteristics.

How to manufacture the image display device according to the fifth example is as follows.

After the insulating protective layer of the thin film transistor element was formed in the same approach as the thin film transistor of the fourth example, the interlayer insulating layer 180 made from polymer was formed on the insulating protective layer, and vias were formed by dry etching. Thereafter, the pixel electrode 190 made from ITO was formed. 480×640 thin film transistors, each of which was formed with the insulating layer 180 set forth above and had the size of 125 μm×125 μm, were arranged to form a film transistor array substrate. Sandwiching the electrophoresis member 22 between the thin film transistor array substrate and the opposite electrode 210 produced the image display device 200 according to the fifth example illustrated in FIG. 10. When the image display device according to the fourth example was driven, it was ensured that the image display device was capable of good displays.

Sixth Example

The thin film transistor element having the same structure as that illustrated in FIG. 7 was manufactured in the same procedure as the procedure for the fourth example except that the second insulating protective layer 160b was an SiO$_2$ film having a thickness of 80 nm deposited by sputtering. At that time, input power, gas flow rate Ar, and deposition pressure during deposition of the SiO$_2$ film were set to 500 W, 50 and 1.0 Pa, respectively.

The concentration of hydrogen atoms contained in each of the insulating protective layers 160a and 160b of the thin film transistor element of the sixth example manufactured set forth above was measured using an SIMS system. As a result, the concentration of hydrogen atoms contained in the insulating protective layer 160a was $4.2 \times 10^{21}$/cm$^3$, and that of hydrogen atoms contained in the insulating protective layer 160b was $7.9 \times 10^{19}$/cm$^3$.

The electric conductivity of each of the semiconductor region 150a and the insulating region 150b of the metal oxide layer was measured using a semiconductor parameter analyzer. As a result, the electric conductivity of the semiconductor region 150a was $1.9 \times 10^{-4}$ Scm, and the electric conductivity of the insulating region 150b was $6.0 \times 10^{-10}$ Scm.

The thin film transistor element has a mobility of 8 cm$^2$/Vs, an ON/OFF ratio of five-digit numbers upon a voltage of 10 V being applied across the source electrode 12 and the drain electrode 14, and a subthreshold swing value, i.e. an S value, of 1.3 V/decade. The measured results demonstrate that the thin film transistor element exhibits good transistor characteristics.

How to manufacture the image display device according to the sixth example is as follows.

After the insulating protective layer of the thin film transistor element was formed in the same approach as the thin film transistor of the sixth example, the interlayer insulating layer 180 made from polymer was formed on the insulating protective layer, and vias were formed by dry etching. Thereafter, the pixel electrode 190 made from ITO was formed. 480×640 thin film transistors, each of which was formed with the interlayer insulating layer 180 set forth above and had the size of 125 μm×125 μm, were arranged to form a film transistor array substrate. Sandwiching the electrophoresis member 22 between the thin film transistor array substrate and the opposite electrode 210 produced the image display device 200 according to the sixth example, the structure of which is the same as that illustrated in FIG. 8. When the image display device according to the sixth example was driven, it was verified that the image display device was capable of good displays.

Seventh Example

The thin film transistor element having the same structure as that illustrated in FIG. 7 was manufactured in the same procedure as the procedure for the fourth example except that the second insulating protective layer 160b was an Al$_2$O$_3$ film having a thickness of 80 nm deposited by atomic deposition. Note that the Al$_2$O$_3$ film was made from Trimethyl aluminum and H$_2$O, and deposited at substrate temperature of 150° C.

The concentration of hydrogen atoms contained in each of the insulating protective layers 160a and 160b of the thin film transistor element of the seventh example manufactured set forth above was measured using an SIMS system. As a result, the concentration of hydrogen atoms contained in the insulating protective layer 160a was $2.1 \times 10^{21}$/cm$^3$, and that of hydrogen atoms contained in the insulating protective layer 160b was $9.1 \times 10^{19}$/cm$^3$.

The electric conductivity of each of the semiconductor region 150a and the insulating region 150b of the metal oxide layer was measured using a semiconductor parameter analyzer. As a result, the electric conductivity of the semiconductor region 150a was $1.7 \times 10^{-4}$ Scm, and the electric conductivity of the insulating region 150b was $4.0 \times 10^{-10}$ Scm.

The thin film transistor element has a mobility of 7 cm$^2$/Vs, an ON/OFF ratio of five-digit numbers upon a voltage of 10 V being applied across the source electrode 12 and the drain electrode 14, and a subthreshold swing value, i.e. an S value, of 1.5 V/decade. The measured results demonstrate that the thin film transistor element exhibits good transistor characteristics.

How to manufacture the image display device according to the seventh example is as follows.

After the insulating protective layer of the thin film transistor element was formed in the same approach as the thin film transistor of the seventh example, the interlayer insulating layer 180 made from polymer was formed on the insulating protective layer, and vias were formed by dry etching. Thereafter, the pixel electrode 190 made from ITO was formed. 480×640 thin film transistors, each of which was formed with the interlayer insulating layer 180 set forth above and had the size of 125 μm×125 μm, were arranged to for a film transistor array substrate. Sandwiching the electrophoresis member 22 between the thin film transistor array substrate and the opposite electrode 210 produced the image display device according to the seventh example, the structure of which is the same as that illustrated in FIG. 8. When the image display device according to the seventh example was driven, it was ensured that the image display device was capable of good displays.

Fourth Comparative Example

A thin film transistor according to the fourth comparative example, the structure of which is illustrated in FIG. 7, was manufactured in the same procedure as that for the fourth example except that the second insulating protective layer 160b was formed in the same conditions as the first insulating protective layer 160a, i.e. the insulating layer 160 was formed in the same conditions as the first insulating protective layer 160a.

The concentration of hydrogen atoms contained in each of the insulating protective layers 160a and 160b of the thin film transistor element of the fourth comparative example was measured using an SIMS system. As a result, the concentration of hydrogen atoms contained in the insulating protective layer 160a was $3.6\times10^{21}/cm^3$, and that of hydrogen atoms contained in the insulating protective layer 160b was $3.8\times10^{21}/cm^3$.

The electric conductivity of each of the semiconductor region 150a and the insulating region 150b of the metal oxide layer was measured using a semiconductor parameter analyzer. As a result, the electric conductivity of the semiconductor region 150a was $1.9\times10^{-4}$ Scm, and the electric conductivity of the insulating region 150b was $2.0\times10^{-4}$ Scm. Measured results of the characteristics of the thin film transistor of the fourth comparative example demonstrate that the level of off-state current of the thin film transistor was high, resulting in insufficient characteristics of the transistor.

Fifth Comparative Example

A thin film transistor according to the fifth comparative example, the structure of which is illustrated in FIG. 9, was manufactured in the same procedure as that for the fifth example except that the first insulating protective layer 160a was formed in the same conditions as the second insulating protective layer 160b, i.e. the insulating layer 160 was formed in the same conditions as the second insulating protective layer 160b.

The concentration of hydrogen atoms contained in each of the insulating protective layers 160a and 160b of the thin film transistor element of the fifth comparative example was measured using an SIMS system. As a result, the concentration of hydrogen atoms contained in the insulating protective layer 160a was $7.0\times10^{19}/cm^3$, and that of hydrogen atoms contained in the insulating protective layer 160b was $6.9\times10^{19}/cm^3$.

The electric conductivity of each of the semiconductor region 150a and the insulating region 150b of the metal oxide layer was measured using a semiconductor parameter analyzer. As a result, the electric conductivity of the semiconductor region 150a was $8.0\times10^{-10}$ Scm, and the electric conductivity of the insulating region 150b was $6.8\times10^{-10}$ Scm. Measured results of the characteristics of the thin film transistor of the fourth comparative example demonstrate that the level of off-state current of the thin film transistor is high, resulting in insufficient characteristics of the transistor.

INDUSTRIAL APPLICABILITY

The thin film transistors according to the present invention can be utilized as switching elements for electronic papers, LCDs, organic EL displays, and the other similar devices. During the whole process, temperature is kept equal to or lower than 150° C., and patterning of the semiconductor layers can be eliminated, making it possible to manufacture devices based on flexible substrates in high throughput, low cost, and high quality. Specifically, they are widely applicable for flexible displays, IC cards, IC tags, and the other similar devices.

DESCRIPTION OF CHARACTERS

1 Thin film transistor
2 Insulating substrate
4 Gate electrode
6 Gate insulating layer
6a First gate insulating layer
6b Second gate insulating layer
8 Semiconductor region
10 Insulating region
12 Source electrode
14 Drain electrode
16 Metal Oxide layer
18 Capacitor electrode
20 Sealing layer
22 Interlayer insulating layer
24 Pixel electrode
26 Thin film transistor array substrate
28 Image display device
30 Opposite electrode
32 Electrophoresis member
100 Insulating substrate
110 Gate electrode
120 Gate insulating layer
130 Source electrode
140 Drain electrode
150 Metal oxide layer
150a Semiconductor region in metal oxide layer
150b Insulating region in metal oxide layer
160 Insulating protective layer
160a First insulating protective layer
160b Second insulating protective layer
170 Capacitor electrode
180 Interlayer insulating layer
190 Pixel electrode
200 Transistor array substrate
210 Opposite electrode
220 Electrophoresis member

The invention claimed is:

1. A thin film transistor comprising, on an insulating substrate, at least:
a gate electrode;
a gate insulating layer;
a source electrode;
a drain electrode;
a metal oxide layer including a semiconductor region and an insulating region, each of the semiconductor region and the insulating region being composed of a same metal oxide material; and
an insulating protective layer,
wherein:
the semiconductor region includes a region between the source electrode and the drain electrode, and is overlaid on a part of each of the source electrode and the gate electrode;
the semiconductor region is formed between the gate insulating layer and the insulating protective layer to abut on at least one of the gate insulating layer and the insulating protective layer;

one part of the gate insulating layer or of the insulating projective layer, which abuts on the semiconductor region, contains therein hydrogen atoms, and a concentration of the hydrogen atoms contained in the one part of the gate insulating layer or of the insulating projective layer is set to be within a range from $1\times10^{20}/cm^3$ to $5\times10^{22}/cm^3$ inclusive; and an other part of the gate insulating layer or of the insulating projective layer, which does not abut on the semiconductor region, contains therein hydrogen atoms, and a concentration of the hydrogen atoms contained in the other part of the gate insulating layer or of the insulating projective layer is set to be lower than $1\times10^{20}/cm^3$.

2. The thin film transistor according to claim 1, wherein:
the gate electrode is formed on the insulating substrate;
the gate insulating layer is formed on the gate electrode and the insulating substrate;
the metal oxide layer is formed on the gate insulating layer;
the source electrode and the drain electrode are formed on the metal oxide layer to abut on the semiconductor region;
the insulating protective layer is formed on the source electrode, the drain electrode, and the metal oxide layer;
the gate insulating layer is composed of a first gate insulating layer abutting on the semiconductor region in the metal oxide layer, and a second gate insulating layer abutting on the insulating region in the metal oxide layer;
a concentration of hydrogen atoms contained in the first gate insulating layer is set to be within a range from $1\times10^{20}/cm^3$ to $5\times10^{22}/cm^3$ inclusive; and
a concentration of hydrogen atoms contained in the second gate insulating layer is set to be lower than $1\times10^{20}/cm^3$.

3. The thin film transistor according to claim 2, wherein:
the first gate insulating layer is composed of silicon nitride.

4. The thin film transistor according to claim 2, wherein:
the second gate insulating layer includes any one of silicon oxide, silicon nitride, silicon oxynitride, and aluminum oxide.

5. The thin film transistor according to claim 1, wherein:
the gate electrode is formed on the insulating substrate;
the gate insulating layer is formed on the gate electrode and the insulating substrate;
the metal oxide layer is formed on the gate insulating layer;
the source electrode and the drain electrode are formed on the gate insulating layer;
the metal oxide layer is formed on the gate insulating layer, the source electrode, and the drain electrode;
the insulating protective layer is formed on the source electrode, the drain electrode, and the metal oxide layer;
the insulating protective layer is composed of a first insulating protective layer abutting on the semiconductor region in the metal oxide layer, and a second protective layer abutting on the insulating region in the metal oxide layer;
a concentration of hydrogen atoms contained in the first insulating protective layer is set to be within a range from $1\times10^{20}/cm^3$ to $5\times10^{22}/cm^3$ inclusive; and
a concentration of hydrogen atoms contained in the second insulating protective layer is set to be lower than $1\times10^{20}/cm^3$.

6. The thin film transistor according to claim 5, wherein:
the first insulating protective layer is composed of silicon nitride.

7. The thin film transistor according to claim 5, wherein:
the second insulating protective layer includes any one of silicon oxide, silicon nitride, silicon oxynitride, and aluminum oxide.

8. The thin film transistor according to claim 1, wherein:
an electric conductivity of the semiconductor region is set to be within a range from $10^{-7}$ S/cm to $10^{-3}$ S/cm inclusive; and
an electric conductivity of the insulating region is set to be lower than $10^{-7}$ S/cm.

9. The thin film transistor according to claim 1, wherein:
the metal oxide material includes any one of indium, zinc, and gallium.

10. The thin film transistor according to claim 1, wherein:
the insulating substrate is a resin substrate.

11. An image display device comprising:
a thin film transistor array equipped with the thin film transistors according to claim 1, and
an image display medium.

12. The image display device according to claim 11, wherein:
the image display medium is an electrophoresis display medium.

* * * * *

UNITED STATES PATENT AND TRADEMARK OFFICE
CERTIFICATE OF CORRECTION

PATENT NO. : 8,963,147 B2
APPLICATION NO. : 13/876419
DATED : February 24, 2015
INVENTOR(S) : Chihiro Imamura et al.

It is certified that error appears in the above-identified patent and that said Letters Patent is hereby corrected as shown below:

In the claims

Claim 1, Column 31, Line 2

Delete "projective" and insert --protective--, therefor.

Claim 1, Column 31, Line 5

Delete "projective" and insert --protective--, therefor.

Claim 1, Column 31, Line 9

Delete "projective" and insert --protective--, therefor.

Claim 1, Column 31, Line 13

Delete "projective" and insert --protective--, therefor.

Signed and Sealed this
Twentieth Day of October, 2015

Michelle K. Lee
*Director of the United States Patent and Trademark Office*